(12) United States Patent
Yang et al.

(10) Patent No.: US 9,165,941 B2
(45) Date of Patent: Oct. 20, 2015

(54) SEMICONDUCTOR MEMORY DEVICES AND METHODS FOR FABRICATING THE SAME

(71) Applicants: Songyi Yang, Seoul (KR); Seungpil Chung, Seoul (KR)

(72) Inventors: Songyi Yang, Seoul (KR); Seungpil Chung, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/221,601

(22) Filed: Mar. 21, 2014

(65) Prior Publication Data
US 2015/0008506 A1    Jan. 8, 2015

(30) Foreign Application Priority Data

Jul. 2, 2013    (KR) ........................ 10-2013-0077185

(51) Int. Cl.
*H01L 27/15*    (2006.01)
*H01L 27/115*    (2006.01)
*H01L 29/792*    (2006.01)

(52) U.S. Cl.
CPC .... *H01L 27/11582* (2013.01); *H01L 27/11575* (2013.01); *H01L 29/7926* (2013.01)

(58) Field of Classification Search
CPC .................. H01L 27/11582; H01L 29/7926
See application file for complete search history.

(56) References Cited

U.S. PATENT DOCUMENTS

| 7,449,780 B2 | 11/2008 | Hua et al. |
| 7,914,973 B2 | 3/2011 | Ryou et al. |
| 2012/0108048 A1* | 5/2012 | Lim et al. .................. 438/586 |

FOREIGN PATENT DOCUMENTS

| JP | H05-047924 A | 2/1993 |
| JP | 2005-045141 A | 2/2005 |
| JP | 2007-214192 A | 8/2007 |
| JP | 2011-029430 A | 2/2011 |
| JP | 2012-028590 A | 2/2012 |
| JP | 2012-089668 A | 5/2012 |
| KR | 10-2011-0024997 A | 3/2011 |
| KR | 10-0302615 B1 | 11/2011 |

* cited by examiner

*Primary Examiner* — Mark Prenty
(74) *Attorney, Agent, or Firm* — Volentine & Whitt, PLLC

(57) ABSTRACT

A semiconductor memory device includes a substrate having a cell region and a peripheral region, a gate stack including a plurality of insulating layers and a plurality of gates alternately stacked on the cell region of the substrate, a stress buffer layer on the gate stack, a vertical channel that extends vertically through the gate stack and is electrically connected to the substrate, a memory layer wrapped around the vertical channel. A bit line electrically connected to the vertical channel may be provided on the gate stack. In a method of fabricating a semiconductor device, the buffer stress layer is formed directly on an upper insulating layer of a stack whose shape is altered to form the gate stack to inhibit warping of the substrate during fabrication of the device.

11 Claims, 37 Drawing Sheets

SEMICONDUCTOR MEMORY DEVICES AND METHODS FOR FABRICATING THE SAME

CROSS-REFERENCE TO RELATED APPLICATIONS

This U.S. nonprovisional patent application claims priority under 35 U.S.C. §119 of Korean Patent Application 10-2013-0077185 filed on Jul. 2, 2013, the entire contents of which are hereby incorporated by reference.

BACKGROUND

The inventive concept relates to semiconductor devices and methods of fabricating the same. In particular, the inventive concept relates to three-dimensional semiconductor memory devices, having vertical channels, and methods of fabricating the same.

In general, many kinds of layers are formed by deposition and patterning processes on a substrate in the manufacturing of semiconductor memory devices. In the case of a three-dimensional semiconductor memory device such as a vertical NAND flash memory, many different kinds of layers, namely, insulating and conductive layers, need to be formed one atop the other on the upper surface of a substrate, and openings through these layers need to be formed and filled to produce features of the device such as the vertical channels. The substrate should remain relatively planar or flat throughout the course of the fabrication process to prevent process failures and poor electrical characteristics.

SUMMARY

The inventive concept provides semiconductor memory devices and methods for fabricating the same in which a substrate is free of warpage.

According to one aspect of the inventive concept, there is provided a semiconductor memory device comprising a substrate including a cell region and a peripheral region, a gate stack including insulating layers and gates alternately stacked on and confined to the cell region of the substrate, at least one side of the gate stack having the form of a staircase, a stress buffer layer on the gate stack, a vertical channel extending vertically through the gate stack and electrically connected to the substrate, a memory layer surrounding the vertical channel, and a bit line on the gate stack and electrically connected to the vertical channel.

According to another aspect of the inventive concept, there is provided method of fabricating a semiconductor device, comprising: forming at least one vertical channel wrapped by a memory layer on a substrate; forming a gate stack including a plurality of word lines vertically stacked along the vertical channel on the substrate, and which has steps in at least one side thereof such that at least one side of the gate stack has the shape of a staircase, wherein forming the gate stack comprises forming a plurality of insulating layers one on another, and patterning the insulating layers; forming a stress buffer layer atop an uppermost one of the insulating layers; and forming a bit line that is electrically connected to the vertical channel on the substrate.

According to still another aspect of the inventive concept, there is provided a method for fabricating a semiconductor device, comprising: alternately forming layers of one insulating material and another material one atop the other on a substrate to form a stack of the layers on an upper surface of the substrate; altering the shape of the stack by performing a series of processes on the stack; and forming a stress buffer layer directly on the uppermost one of the layers of insulating material before at least one of the processes is performed.

BRIEF DESCRIPTION OF THE DRAWINGS

The foregoing and other features and advantages of the inventive concept will be apparent from the particular description of non-limiting embodiments which follows. In the drawings.

DETAILED DESCRIPTION OF THE PREFERRED EMBODIMENTS

Figure 1A:
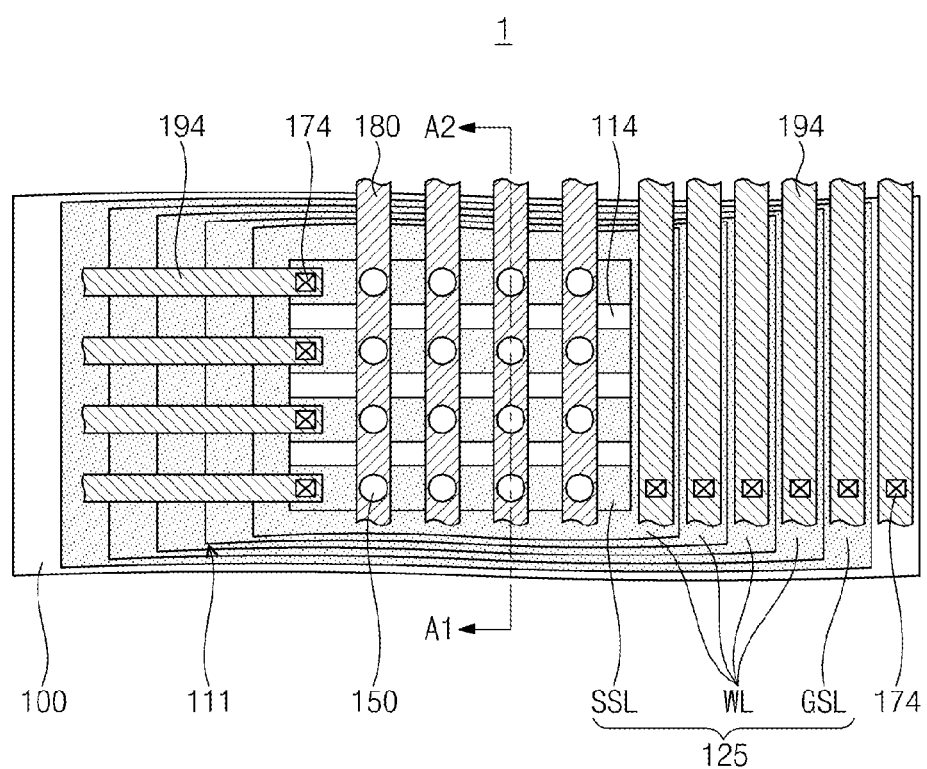
FIG. 1A is a plan view of a semiconductor memory device according to the inventive concept.

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, like numerals are used to designate like elements throughout the drawings.

Furthermore, spatially relative terms, such as "upper" and "lower" are used to describe an element's and/or feature's relationship to another element(s) and/or feature(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use. In addition, the term "top" as used to describe a surface generally refers not only to the orientation depicted in the drawings but to the fact that the surface is the uppermost surface in the orientation depicted, as would be clear from the drawings and context of the written description.

It will also be understood that when an element or layer is referred to as being "on" or "connected to" another element or layer, it can be directly on or directly connected to the other element or layer or intervening elements or layers may be present. In contrast, when an element or layer is referred to as being "directly on" or "directly connected to" another element or layer, there are no intervening elements or layers present.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. Furthermore, when a linear element is referred to as "extending" in a particular direction, it will generally be understood that the direction refers to the longitudinal direction or direction of the lengthwise dimension of the element. When an element or layer is referred to as "covering" another layer or element, it will generally be understood that the former extends over the entirety of the latter and in this respect, the drawings are generally dispositive. Furthermore, the term "staircase" is used throughout the description synonymously with the terms "steps".

FIG. 1A illustrates an embodiment of a semiconductor memory device 1 according to the inventive concept.

The semiconductor memory device 1 has a plurality of vertical channels 150 standing upright on a substrate 100, a plurality of gates 125 vertically stacked along the vertical channels 150, and a plurality of bit lines 180 electrically connected to the vertical channels 150. The substrate 100 may be a semiconductor substrate such as a single-crystalline silicon wafer doped with impurities so as to be of a first conductive type (e.g., p-type). The semiconductor memory device 1 may be a NAND flash memory device or a resistive memory device that further comprises a memory layer 140 between each vertical channel 150 and the gates 125, as illustrated in FIG. 2I.

The gates 125 may constitute at least one ground selection line GSL adjacent to the substrate 100, at least one string selection line SSL adjacent to the bit line 180, and a plurality of word lines WL between the ground selection line GSL and the string selection line SSL. The gates 125 and the substrate 100 may be electrically connected to a plurality of metal lines 194 through a plurality of word line contacts 174. Each of the vertical channels 150 may have a bottom portion that is electrically connected to the substrate 100 and a top portion that is electrically connected to the bit line 180 through a bit line contact 171, as illustrated in FIG. 2I.

The gates 125 may have the shape of pyramid in which at least one, and preferably two or four sides thereof, are in the form of a staircase 111. Therefore, the gates 125 may define pads 125p, as illustrated in FIG. 2I, where the word line contacts 174 connect thereto. Each string selection line SSL may extend longitudinally in a direction intersecting the longitudinal direction of a bit line 180 as viewed in plan. The word lines WL and the ground selection line GSL may each have the shape of a plate having cutouts 114 therethrough and each of which extends in a direction intersecting the longitudinal direction of a bit line 180 as viewed in plan. The cutouts 114 expose the substrate 110.

Figure 2A:
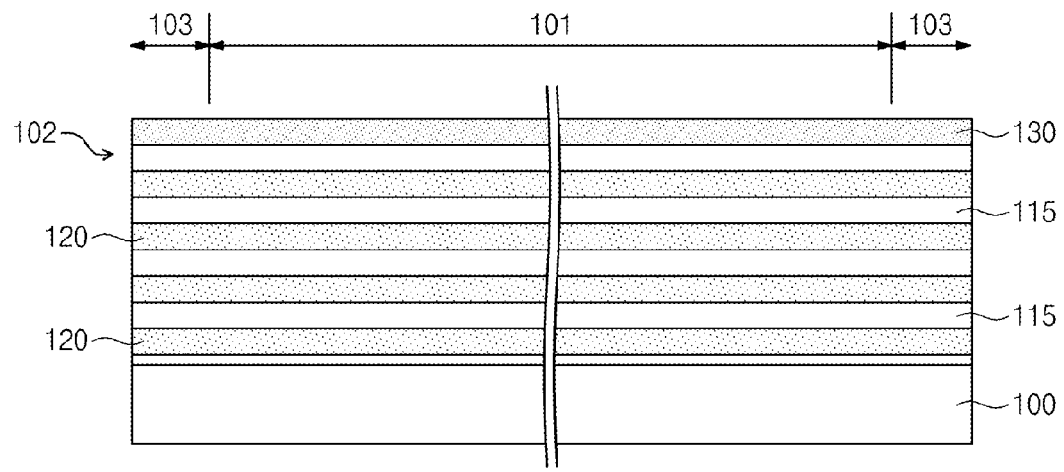
FIGS. 2A, 2B, 2C, 2D, 2E, 2F, 2G, 2H and 2I are cross-sectional views illustrating a method for fabricating a semiconductor memory device according to the inventive concept.
Figure 2B:
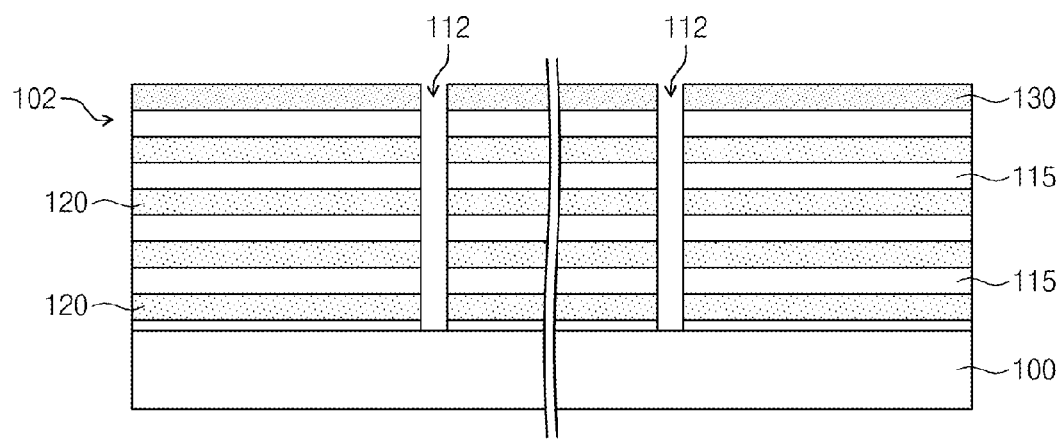
Figure 2C:
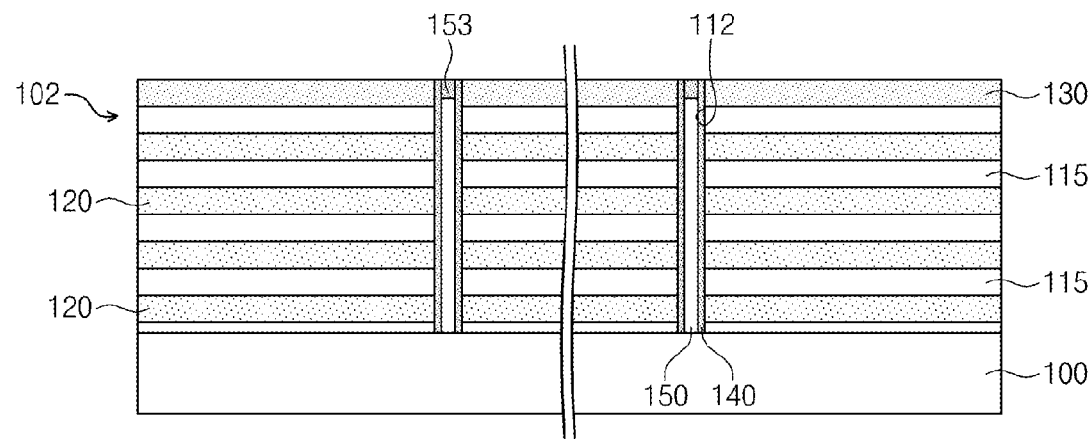
Figure 2D:
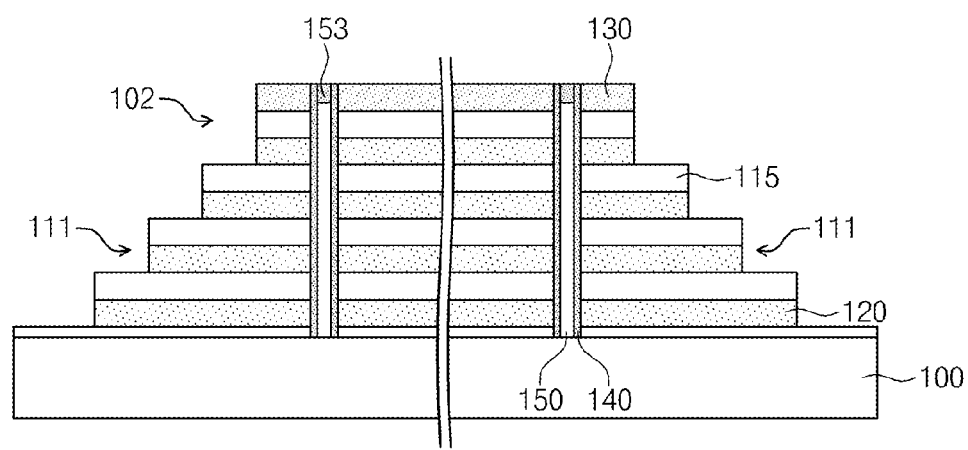
Figure 2E:
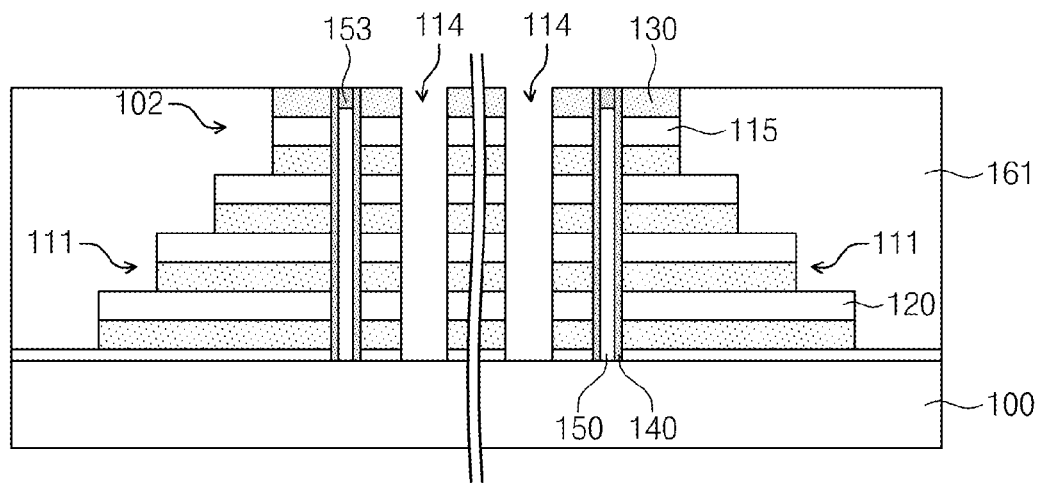
Figure 2F:
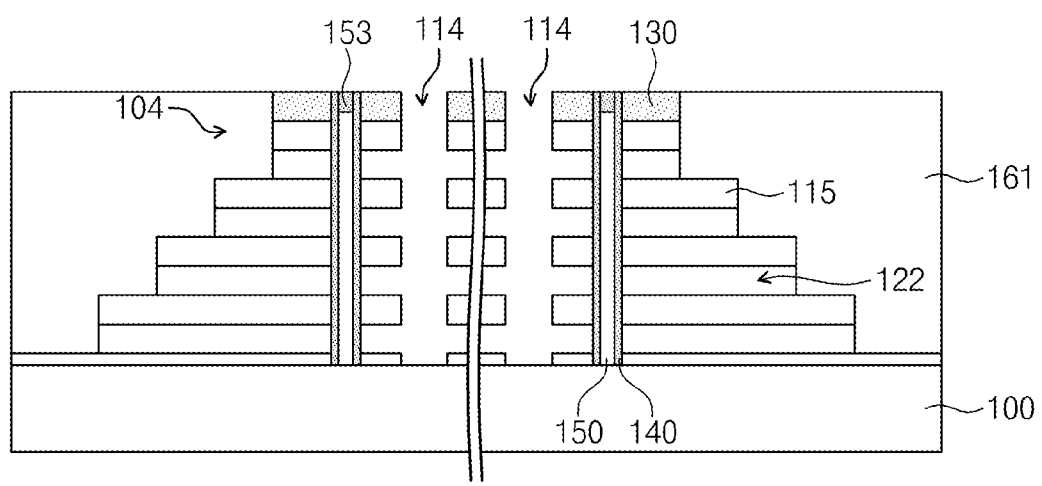
Figure 2G:
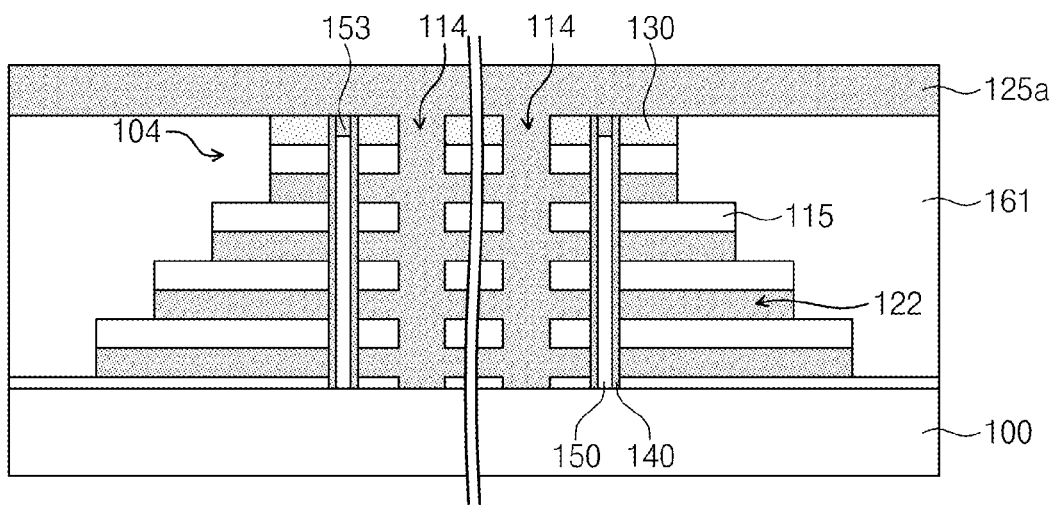
Figure 2H:
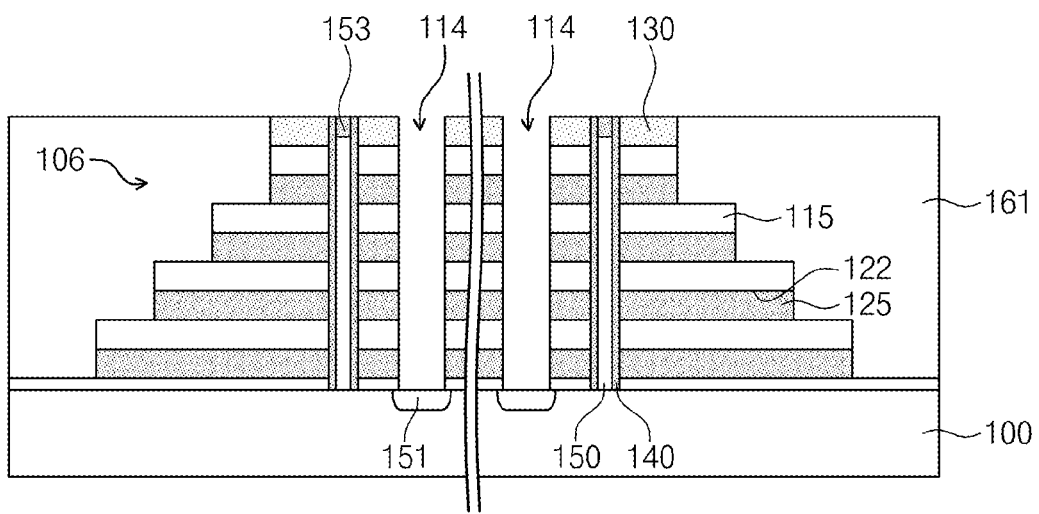
Figure 2I:
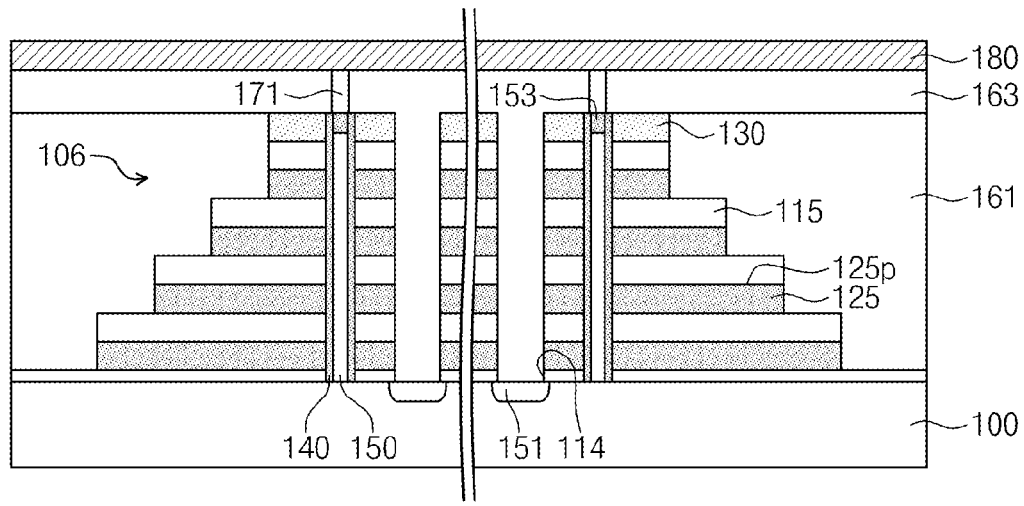

This embodiment of a semiconductor memory device 1 further comprises a stress buffer layer 130, as illustrated in FIG. 2I, which prevents or mitigates the warping of the substrate 100 during a fabrication process.

Figure 1B:
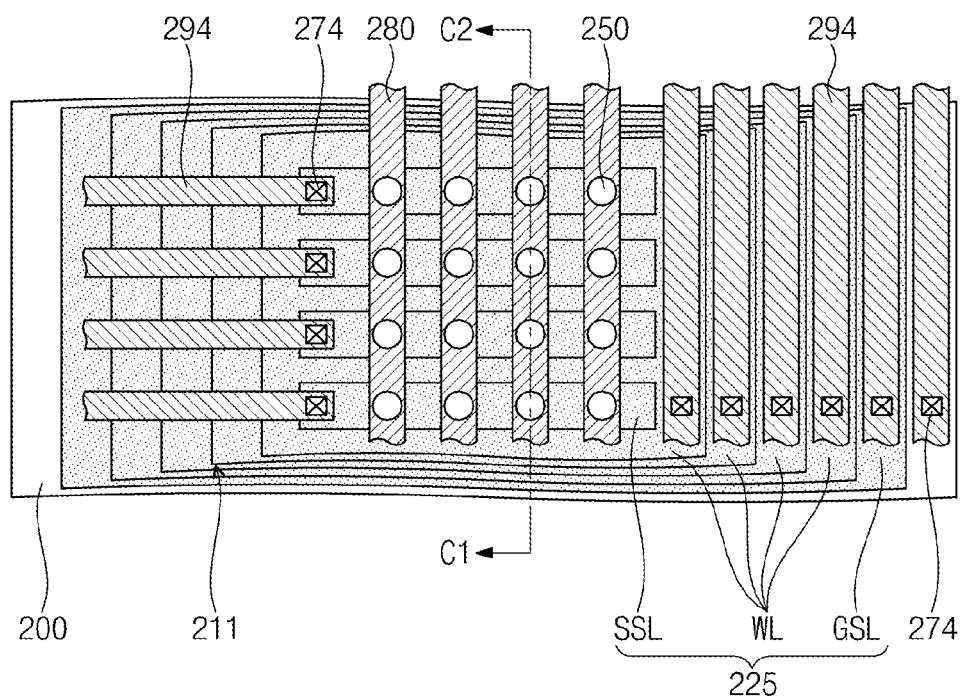
FIG. 1B is a plan view of another embodiment of a semiconductor memory device according to the inventive concept.

FIG. 1B illustrates another embodiment of a semiconductor memory device 13 according to the inventive concept.

The semiconductor memory device 13 has a plurality of vertical channels 250 extending upright on a substrate 200, a plurality of gates 225 stacked along the vertical channels 250, and a plurality of bit lines 280 electrically connected to the vertical channels 250. The semiconductor memory device 13 may be a NAND flash memory device or a resistive memory device that further includes a memory layer 240 extending along each vertical channel 250, as shown in FIG. 13D.

The gates 225 may constitute at least one ground selection line GSL adjacent to the substrate 200, at least one string selection line SSL adjacent to the bit lines 280, and a plurality of word lines WL between the ground selection line GSL and the string selection line SSL. The gates 225 and the substrate 200 may be electrically connected to a plurality of metal lines 294 via a plurality of word line contacts 274. Each of the vertical channels 250 may have a bottom portion electrically connected to the substrate 200 and a top portion electrically connected to a bit line 280 via a bit line contact 271, as illustrated in FIG. 13D.

The gates 225 may have the shape of a pyramid shape in which at least one, and preferably two or four sides thereof, have the form of a staircase 211. Accordingly, the gates 225 may define pads 225p where the word line contacts 274 connect thereto. The string selection line SSL may extend linearly in a direction intersecting the longitudinal directions of the bit lines 280 as viewed in plan. The word lines WL and the ground selection line GSL may each have the form of a plate.

Figure 13A:
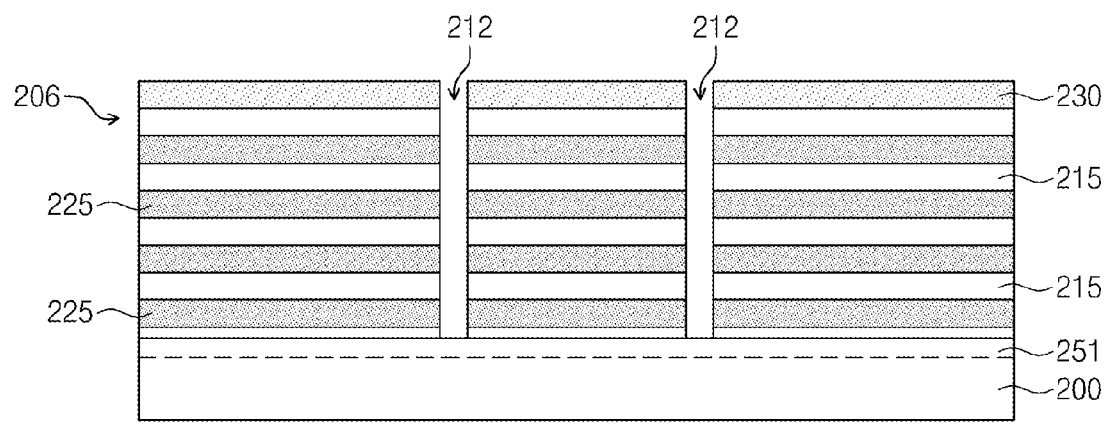
FIGS. 13A, 13B, 13C and 13D are cross-sectional views illustrating a method for fabricating a semiconductor memory device according to the inventive concept.
Figure 13B:
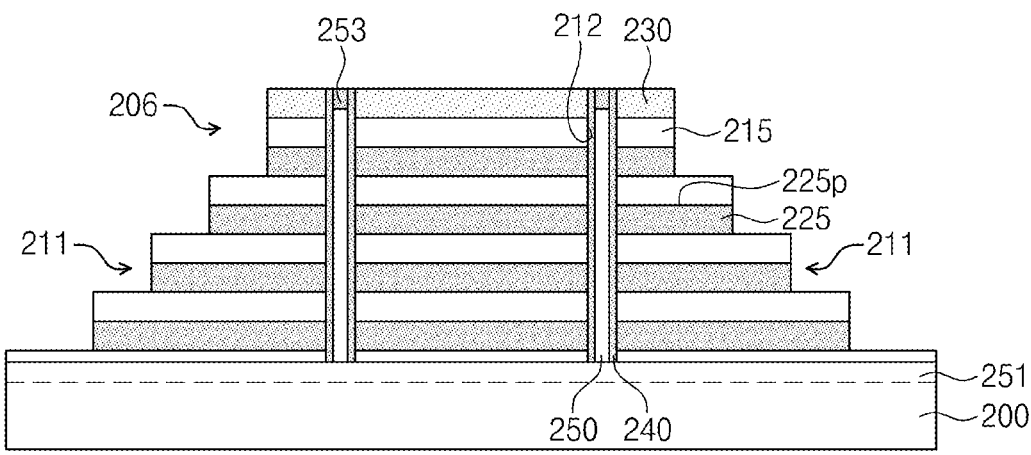
Figure 13C:
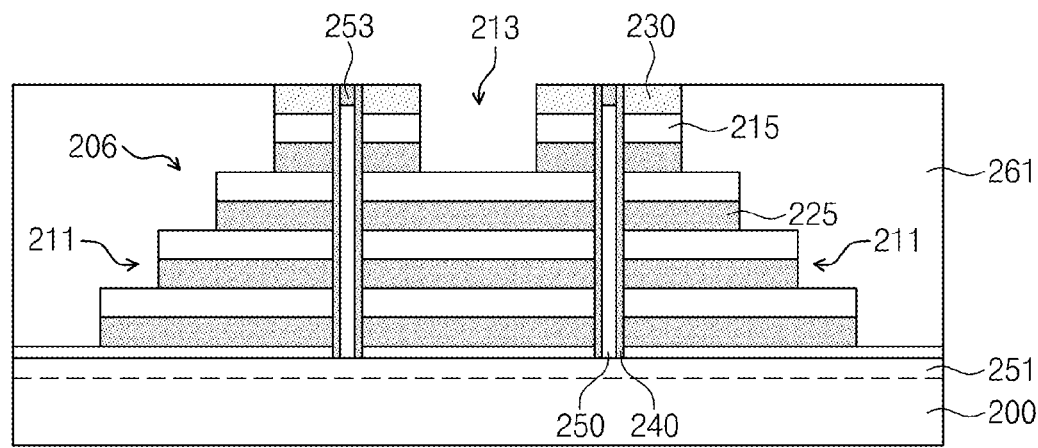
Figure 13D:
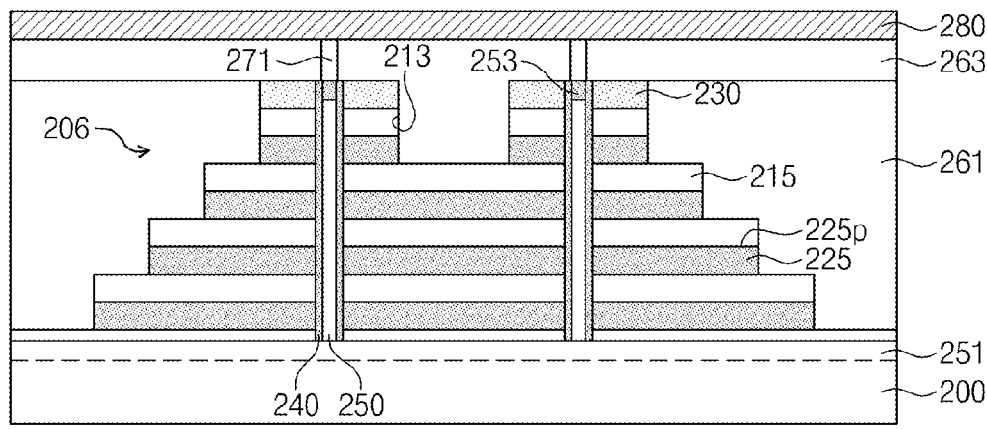

In this embodiment, the semiconductor memory device 13 further comprises a stress buffer layer 230 as illustrated in FIG. 13D, which prevents or mitigates the warping of the substrate 200 during a fabrication process.

An embodiment of a method of fabricating a semiconductor memory device of the type shown in FIG. 1A, according to the inventive concept, is illustrated in FIGS. 2A to 2I.

Referring to FIG. 2A, a mold stack 102 is formed on substrate 100, and stress buffer layer 130 is formed to cover the mold stack 102. The substrate 100 may be divided into a cell region 101 and a peripheral region 103. The mold stack 102 is formed by alternately stacking a plurality of mold insulating layers 115 and a plurality of mold sacrificial layers 120. The mold insulating layers 115 and the mold sacrificial layers 120 may be insulators having etch selectivity with respect to one another. For example, the mold insulating layers 115 may each comprise a silicon oxide layer (e.g., $SiO_2$), and the mold sacrificial layers 120 may each comprise a silicon nitride layer (e.g., SiN or $Si_3N_4$).

The stress buffer layer 130 may be a mono-layer of silicon oxide (e.g., $SiO_2$), silicon nitride (e.g., SiN or $Si_3N_4$), silicon oxynitride layer (e.g., SiON), or polysilicon, or a laminate of any combination of layers thereof. The stress buffer layer 130 may be formed in the shape of a plate that completely covers the substrate 100, thereby covering the cell region 101 and the peripheral region 103. Also, the stress buffer layer 130 may have a thickness (e.g., about 10 nm to about 200 nm) identical to or greater than any of those of the mold insulating layers 115 and the mold sacrificial layers 120.

In the case in which the mold insulating layers 115 and the stress buffer layer 130 each comprise a silicon oxide layer, the silicon oxide layer constituting the stress buffer layer 130 may have a composition, physical characteristics, and/or chemical characteristics identical to or different from those of silicon oxide layers constituting the mold insulating layers 115, and may be formed by the same or different methods. For example, the mold insulating layers 115 may be formed by a plasma deposition process using $SiH_4$ as a source, and the stress buffer layer 130 may be created by a plasma deposition process using TEOS as a source.

Similarly, in the case in which the mold sacrificial layers 120 and the stress buffer layer 130 each comprise a silicon nitride layer, the silicon nitride layer constituting the stress buffer layer 130 may have a composition, physical characteristics, and/or chemical characteristics identical to or different from those of the silicon nitride layers constituting the mold sacrificial layers 120, and may be formed by the same or different methods. For example, the mold sacrificial layers 120 may be formed by a plasma deposition process under a low temperature (e.g., about 300° C.), and the stress buffer layer 130 may be created by a plasma deposition process under a high temperature (e.g., about 900° C.).

Referring to FIG. 2B, a channel hole 112 in the form of a pillar is formed through the stress buffer layer 130 and the mold stack 102 to expose the substrate 100. An anisotropic etching process, for example, a dry etch, may be performed on the stress buffer layer 130 and the mold stack 102 to form the channel hole 112.

Referring to FIG. 2C, memory layer 140 and vertical channels 150 are formed in the channel hole 112. The memory layer 140 extends along the channel hole 112 around each vertical channel 150. The vertical channel 150 penetrates the stress buffer layer 130 and the mold stack 102 so as to be electrically connected to the substrate 100.

The memory layer 140 may comprise a charge trapping layer or a variable resistance layer. For example, the memory layer 140 may comprise a blocking insulation layer in contact with an inner wall of the tack that defines the channel hole 112, a tunnel insulation layer in contact with the vertical channel 150, and a trap insulation layer interposed between the blocking insulation layer and the tunnel insulation layer, in which case a NAND Flash memory device may be formed according to the inventive concept. Alternatively, the memory layer 140 may comprise a transitional metal oxide layer, in which case a resistive memory device (RRAM) may be formed according to the inventive concept.

The vertical channel 150 may be formed in the shape of a pillar by depositing a material (e.g., silicon) identical or similar to that of the substrate 100. Selectively, a drain 153 may be formed by implanting impurities into a top portion of the vertical channel 150. Alternatively, the drain 153 may be formed simultaneously with a common source 151, which will be explained later with reference to FIG. 2H.

The etching process for forming the channel hole 112 has the potential to warp the substrate 100. For example, the substrate 100 may suffer from stress during the etching process because the mold stack 102 on the substrate 100 is formed of different materials. The stress may be an in-wafer stress that is applied globally to the substrate 100 or an in-chip stress that is applied locally to the substrate 100. In either case, the substrate 100 would bend upward or downward due to the stress producing a curvature along the length of the channel hole 112.

Likewise, the forming of the mold stack 102 has the potential to bend the substrate 100 upward due to stress exerted from the mold insulating layers 115 and the mold sacrificial layers 120. In this case, the substrate 100 would be bent downward when the channel hole 112 is formed due to stress relief occurring when the channel hole 112 is formed in the mold stack 102. Again, such a bending of the substrate 100 would impart a curvature to the channel hole 112 along its length.

Any curvature in the length of the channel hole 112 could result in a flection or a cut off in the memory layer 140 and/or vertical channel 150. Also, if the substrate 100 is excessively warped, the channel hole 112 may not reach the substrate 100, i.e., the substrate 100 may not exposed.

The stress buffer layer 130 is provided in light of what the inventors have considered to be these potential problems, to enhance the rigidity of the substrate 100 during crucial parts of the fabrication process. In particular, the stress buffer layer 130 may prevent or inhibit a warping of the substrate 100 when the channel hole 112 is formed. Alternatively, when the substrate 100 is bent during and due to the forming of the mold stack 102, the stress buffer layer 130 may keep the substrate 100 bent during the subsequent forming of the channel hole 112 such that the channel hole 112 may be formed to have a substantially straight line shape.

Referring to FIG. 2D, the stress buffer layer 130 and the mold stack 102 may be patterned to form a staircase 111 in at least one side of the mold stack 102. In this respect, the stress buffer layer 130 may be patterned together with the mold stack 102 to have a shape conforming to and covering an uppermost one of the mold insulating layers 115. The staircase 111 may be formed by repeatedly trimming an etching mask formed on the stress buffer layer 130 and performing an anisotropic etching process on the mold stack 102 to remove part of the mold stack 102. Therefore, the substrate 100 may be bent due to stress generated by the selective removing of parts of the mold stack 102.

In this case as well, the stress buffer layer 130 may prevent or inhibit the warping of the substrate 100 due to the stress.

Referring to FIG. 2E, the mold stack 102 is patterned to form word line cutout 114 between adjacent vertical channels 150. For example, an isotropic etching process (e.g., dry etch) may be selectively preformed on the mold insulating layers 115 and the mold sacrificial layers 120 between the adjacent vertical channels 150 such that the word line cutout 114 is formed to expose the substrate 100 or a lowermost one of the mold insulating layers 115. The word line cutout 114 may be in the form of a trench as previously described with reference to FIG. 1A.

The forming of the word line cutout 114, i.e., the selective removal of part of the mold stack 102, has the potential to generate stress which warps the substrate 100. At this time, the warping of the substrate 100 may be prevented or inhibited by the stress buffer layer 130.

Before the word line cutout 114 is formed, an insulator (e.g., silicon oxide) may be deposited and planarized to form a dielectric capping layer 161 that covers the staircase(s) 111. In this case, too, the stress buffer layer 130 may prevent or inhibit the warping of the substrate 100.

Referring to FIG. 2F, the mold sacrificial layers 120 are selectively removed to form a mold wing 104. For example, if the mold sacrificial layers 120 are silicon nitride layers, an etchant such as phosphoric acid (e.g., $H_3PO_4$) may be provided through the word line cutout 114 to selectively remove the mold sacrificial layers 120, thereby forming spaces 122. This wet etch may form the mold wing 104 that comprises the mold insulating layers 115 vertically spaced apart from each other and arranged along the vertical channel 150.

The stress buffer layer 130 may be removed together with the mold sacrificial layers 120 or may be left in place at this time. For example, in the case in which the mold sacrificial layers 120 are silicon nitride layers (e.g., SiN, $Si_3N_4$) and the stress buffer layer 130 is a silicon oxynitride layer (e.g., SiON), a silicon oxide layer (e.g., $SiO_2$) or any combination thereof, the stress buffer layer 130 may be left on the patterned mold stack. Alternatively, in the case in which the mold sacrificial layers 120 and the stress buffer layer 130 are silicon nitride layers (e.g., SiN, $Si_3N_4$), the stress buffer layer 130 may be removed together with the mold sacrificial layers 120 by the etchant, i.e., phosphoric acid.

Referring to FIG. 2G, a conductive layer 125a is formed to cover the mold wing 104. For example, the conductive layer 125a may be formed by depositing a silicon layer, a metal layer, a metal nitride layer or a metal silicide layer on the substrate 100. The conductive layer 125a fills the word line cutout 114 and the spaces 122.

Referring to FIG. 2H, the conductive layer 125a may be planarized and then anisotropically etched to form the gates 125 filling the spaces 122. As a result, a gate stack 106 that comprises a plurality of gates 125 disposed between the mold insulating layers 115 is formed. Also, impurities may be implanted into the substrate 100 exposed through the word line cutout 114 to form a common source 151 of a second conductive type (e.g., n-type) different from that of the substrate 100. The drain 153 may be formed simultaneously with the common source 151, instead of in the manner illustrated in FIG. 2C. A plurality of common sources 151 may be electrically connected to each other and may have a same electrical potential. The gates 125 and the common source 151 may extend in a direction which is identical to the horizontal longitudinal direction of the word line cutout 114.

Referring to FIG. 2I, bit lines 180 electrically connected to the vertical channels 150 are formed. For example, an interlayer dielectric layer 163 may be formed, on the substrate 100, to cover the gate stack 106 and fill the word line cutout 114, and bit line contacts 171 may be formed through the interlayer dielectric layer 163 so as to be electrically connected to the drains 153. Then the bit lines 180 are formed, on the interlayer dielectric layer 163, to be electrically connected to the bit line contacts 171.

An end portion of each gate 125 defines a pad 125p because it is not covered by any upper gate 125. The pad 125p may contact the word line contact 174 which is electrically connected to the metal line 194 as illustrated in FIG. 1A. The metal line 194 may be formed on the interlayer dielectric layer 163.

Through the above processes, there is formed a semiconductor memory device 1 that comprises the stress buffer layer 130 covering the uppermost one of the mold insulating layers 115 and the vertical channel 150 penetrating the stress buffer layer 130 as well as the gate stack 106. Furthermore, a lowermost one of the gates 125 may constitute a ground selection line GSL, an uppermost one of the gates 125 may constitute a string selection line SSL, and intermediate gates 125 may constitute word lines WL as illustrated in FIG. 1A.

Figure 2J:
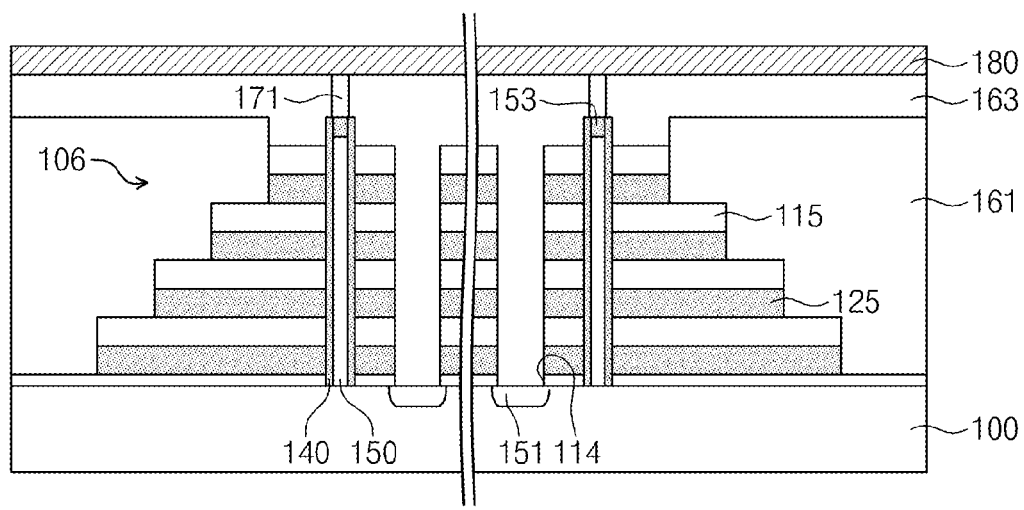
FIGS. 2J and 2K are cross-sectional views of illustrating steps in other versions of the method.

As mentioned above, as an alternative, the stress buffer layer 130 may be removed together with the mold sacrificial layers 120 by the etchant (e.g., phosphoric acid) when the mold wing 104 is formed at the point in the process illustrated in FIG. 2F. In this case, a semiconductor memory device 2 without the stress buffer layer 130 is formed, as illustrated in FIG. 2J.

Figure 2K:
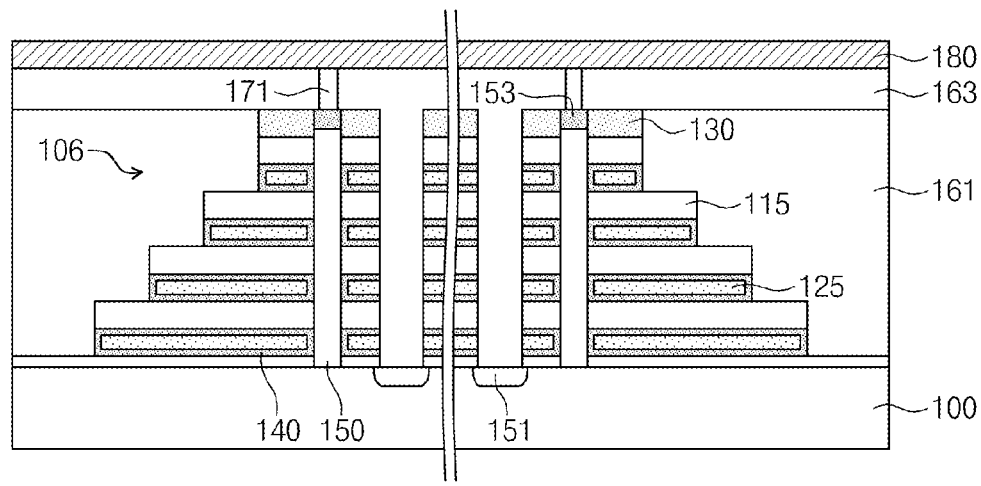

As another variation of this embodiment, the memory layer 140 may be formed within the spaces 122 at the point in the process illustrated in FIG. 2F. In this case, a semiconductor memory device 17 including a memory layer 140 which encloses the gates 112 is formed, as illustrated in FIG. 2K.

Figure 3A:
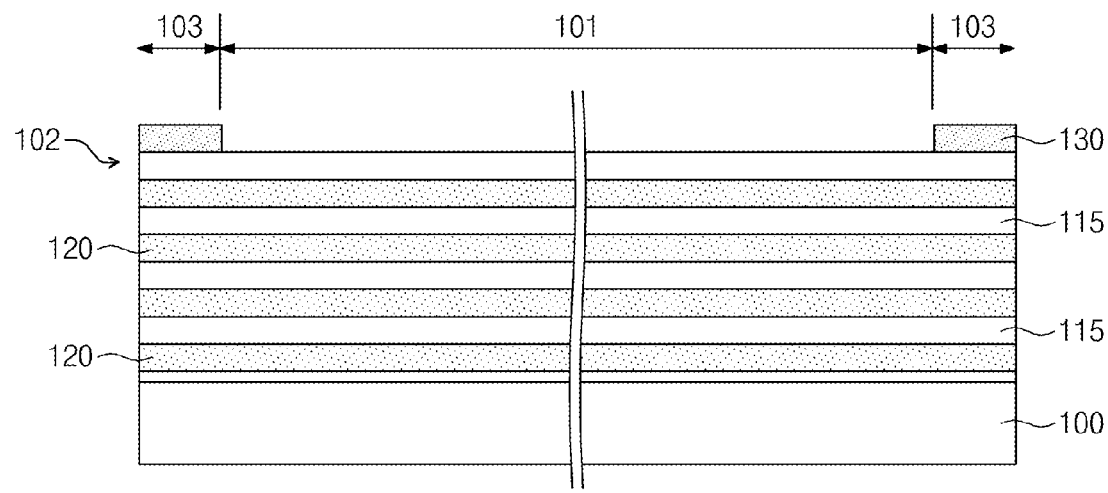
FIGS. 3A, 3B and 3C are cross-sectional views illustrating a method for fabricating a semiconductor memory device according to the inventive concepts.
Figure 3B:
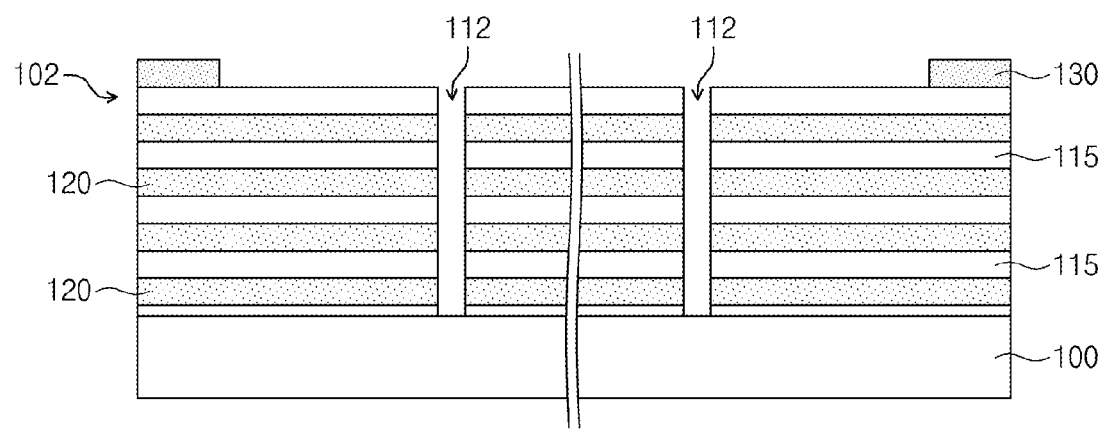
Figure 3C:
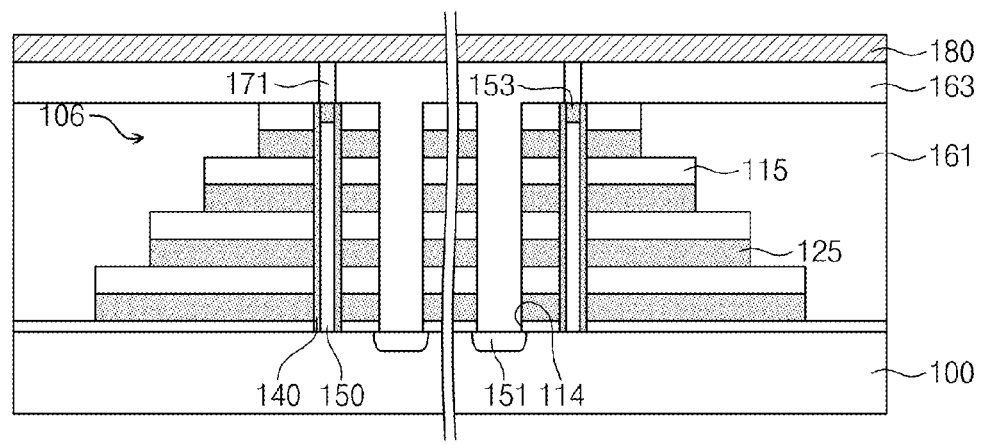

A method for fabricating a semiconductor memory device according to the inventive concept is illustrated in FIGS. 3A to 3C.

Figure 3D:
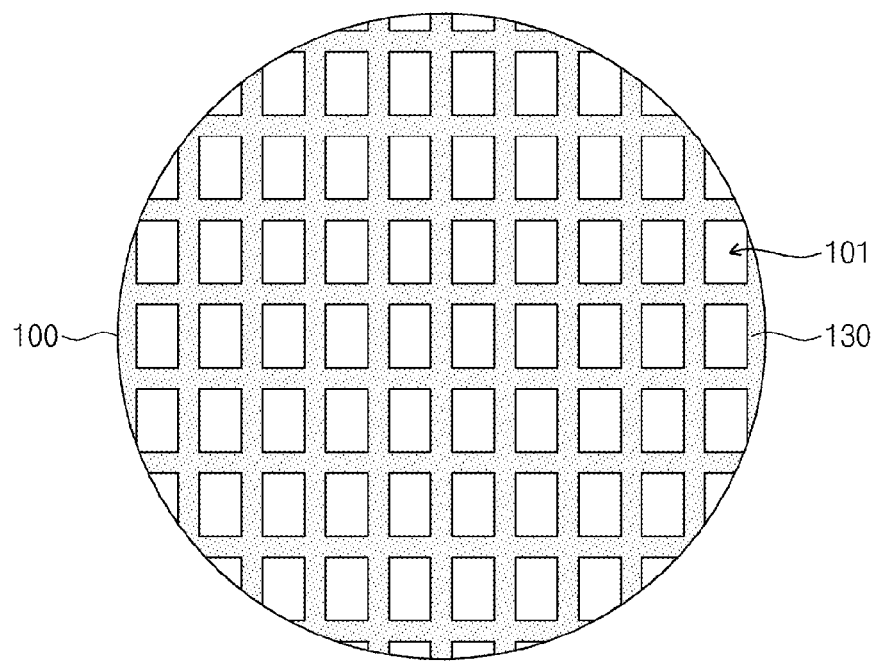
FIG. 3D is a plan view of the device fabricated by the method of FIGS. 3A-3C.

Referring to FIG. 3A, mold stack 102 is formed on the substrate 100, and stress buffer layer 130 is formed on the mold stack 102. The stress buffer layer 130 is open over the cell region 101 and covers the peripheral region 103. The stress buffer layer 130 may be formed by depositing silicon nitride (e.g., SiN, $Si_3N_4$) on the entire top surface of the mold stack 102 and patterning the resulting silicon nitride layer to expose the cell region 101. On a large scale, the stress buffer layer 130 may have the shape of a grid as illustrated in FIG. 3D.

Referring to FIG. 3B, channel hole 112 is formed to penetrate the mold stack 102 and expose the substrate 100. An anisotropic etching process (e.g., dry etch) may be performed on the mold stack 102 to form the channel hole 112 in the shape of a pillar.

Referring to FIG. 3C, processes similar to those described with reference to FIGS. 2C to 2I are performed to fabricate a semiconductor memory device 3 free of the stress buffer layer 130. In this regard, the stress buffer layer 130 may be removed when the mold stack 102 is patterned in the process described with reference to and illustrated in FIG. 2D, or when the mold wing 104 is formed by selectively removing the mold sacrificial layers 120 as illustrated in FIG. 2F.

Another method of fabricating a semiconductor memory device according to the inventive concept is illustrated in FIGS. 4A to 4F.

Figure 4A:
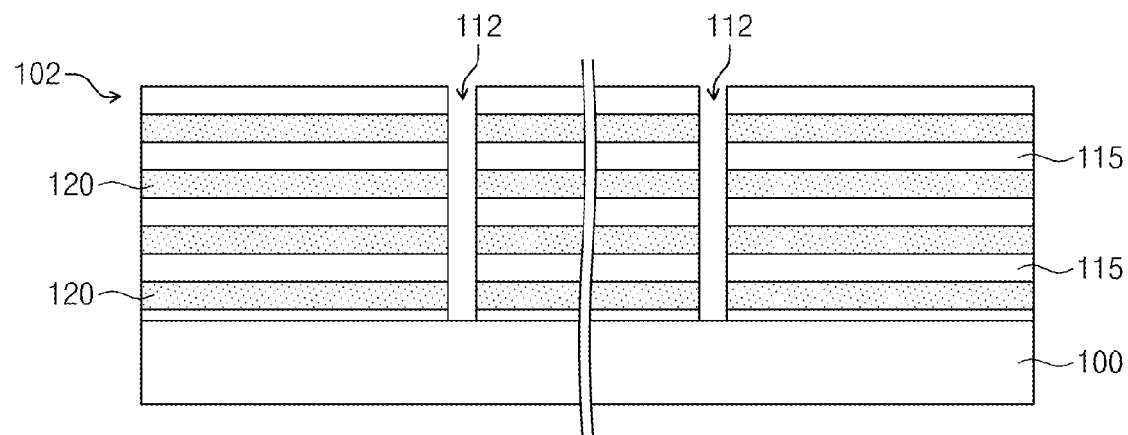
FIGS. 4A, 4B, 4C, 4D, 4E and 4F are cross-sectional views illustrating a method for fabricating a semiconductor memory device according to the inventive concept.

Referring to FIG. 4A, the channel hole 112 is formed to penetrate the mold stack 102 and expose the substrate 100. For example, the mold insulating layers 115 and the mold sacrificial layers 120 may be alternately stacked on the substrate 100 so as to form the mold stack 102, and the mold stack 102 may be anisotropically etched to form the channel hole 112.

Figure 4B:
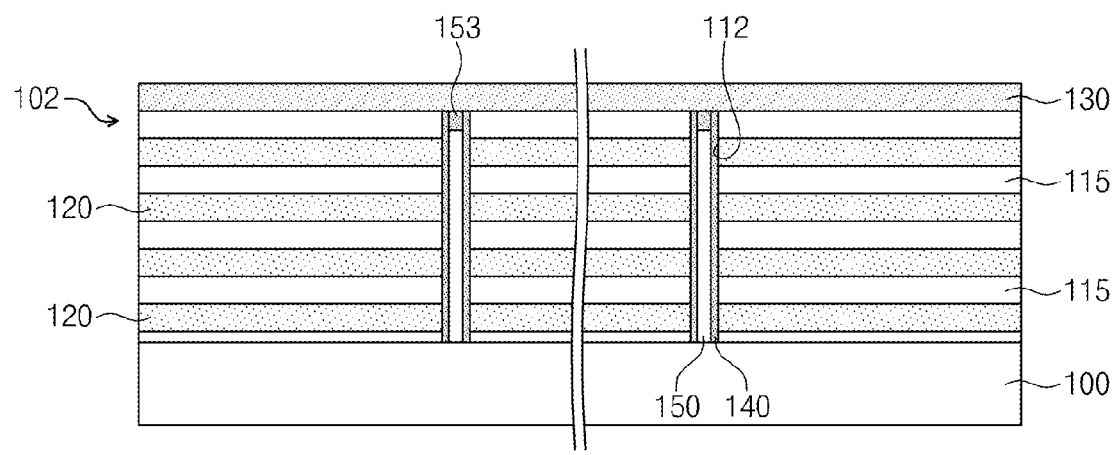

Referring to FIG. 4B, the memory layer 140 and the vertical channel 150 are formed in the channel hole 112, and the stress buffer layer 130 is formed to entirely cover the substrate 100. The stress buffer layer 130 may be formed as a silicon oxide layer (e.g., $SiO_2$), a silicon nitride layer (e.g., SiN, $Si_3N_4$), a silicon oxynitride layer (e.g., SiON) or any combination thereof. The top portion of the vertical channel 150 is doped with impurities to form the drain 153.

Figure 4C:
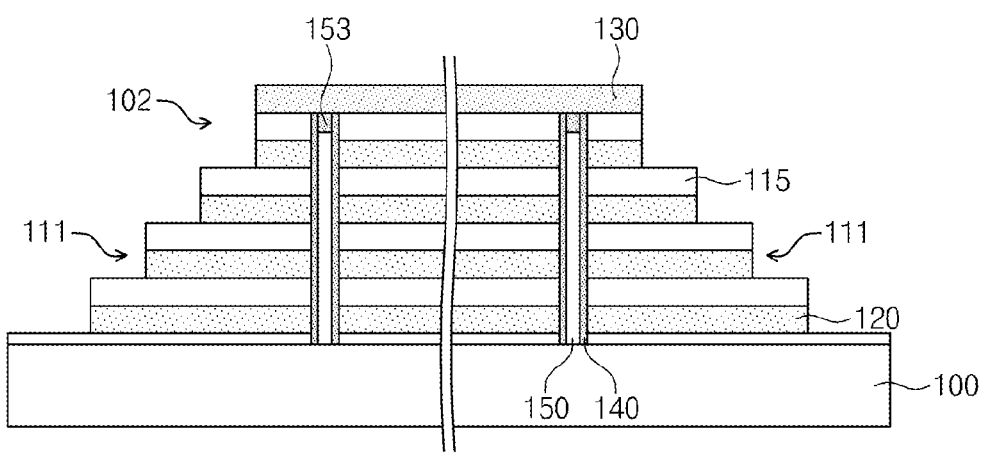

Referring to FIG. 4C, the stress buffer layer 130 and the mold stack 102 are patterned to form the staircases 111 at the sides, in this example, of the mold stack 102. The stress buffer layer 130 may be patterned together with the mold stack 102 to cover the uppermost one of the mold insulating layers 115 and the vertical channel 150.

Figure 4D:
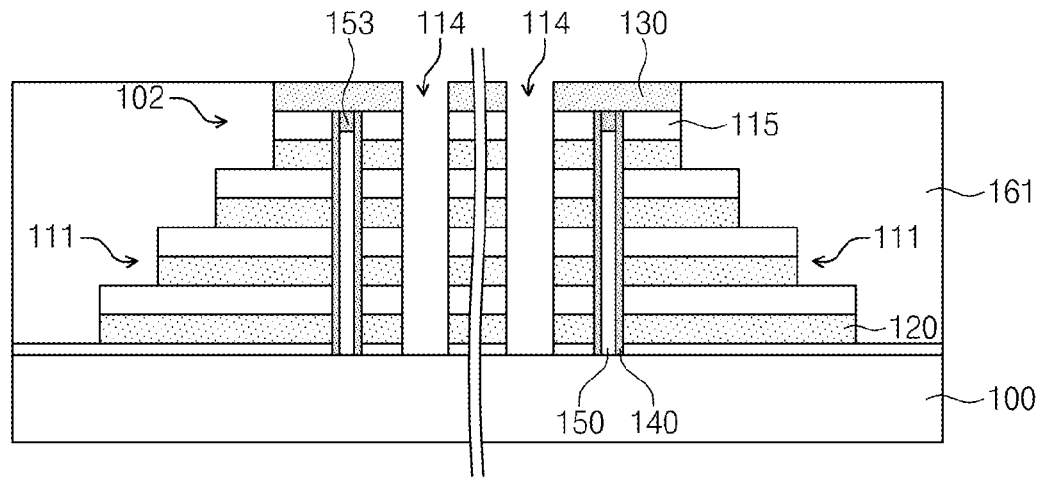

Referring to FIG. 4D, the dielectric capping layer 161 may be formed to cover the staircases 111. Also, the word line cutout 114 is formed to penetrate the stress buffer layer 130 and the mold stack 102. The word line cutout 114 may formed between adjacent ones of the vertical channels 150. The dielectric capping layer 161 may be formed before the word line cutout 114 is formed.

Figure 4E:
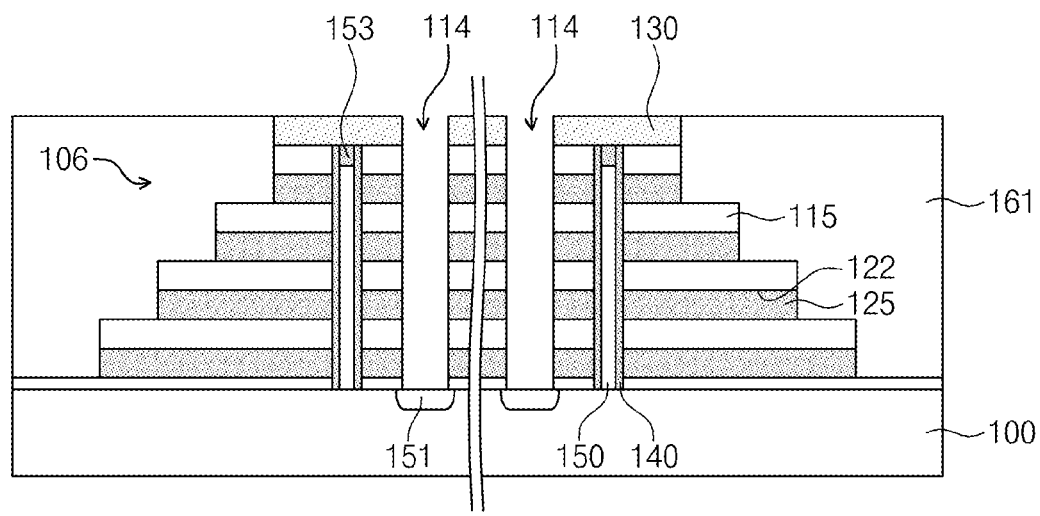

Referring to FIG. 4E, the gates 125 between the mold insulating layers 115 are formed to produce the gate stack 106. For example, the mold stack 102 may be selectively etched with an etchant (e.g., phosphoric acid) to remove the mold sacrificial layers 120, and conductive material may be deposited and etched to form the gates 125 filling the spaces 122. The substrate 100 exposed through the word line cutout 114 may be doped with impurities to form the common source 151. The stress buffer layer 130 may be left atop the gate stack 106 or removed together with the mold sacrificial layers 120.

Figure 4F:
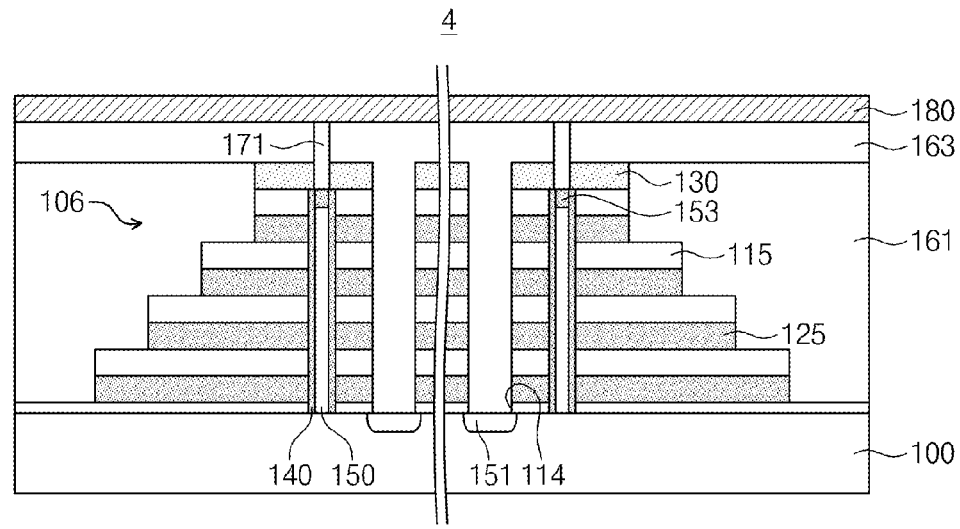

Referring to FIG. 4F, the interlayer dielectric layer 163 is formed on the dielectric capping layer 161 so as to cover the stress buffer layer 130 and fill the word line cutout 114, the bit line contact 171 contacting the drain 153 is formed to penetrate the interlayer dielectric layer 163 and the stress buffer layer 130, and the bit line 180 is formed on the interlayer dielectric layer 163 to be electrically connected to the bit line contact 171. As a result, a semiconductor memory device 4, comprising the stress buffer layer 130 covering the uppermost one of the mold insulating layers 115 and the vertical channel 150 penetrating the gate stack 106, is fabricated. Alternatively, in case in which the stress buffer layer 130 was removed together with the mold sacrificial layers 120, a semiconductor memory device 2 having features similar to that of FIG. 2J is fabricated.

Still another method of fabricating a semiconductor memory device according to the inventive concept is illustrated in FIGS. 5A to 5F.

Figure 5A:
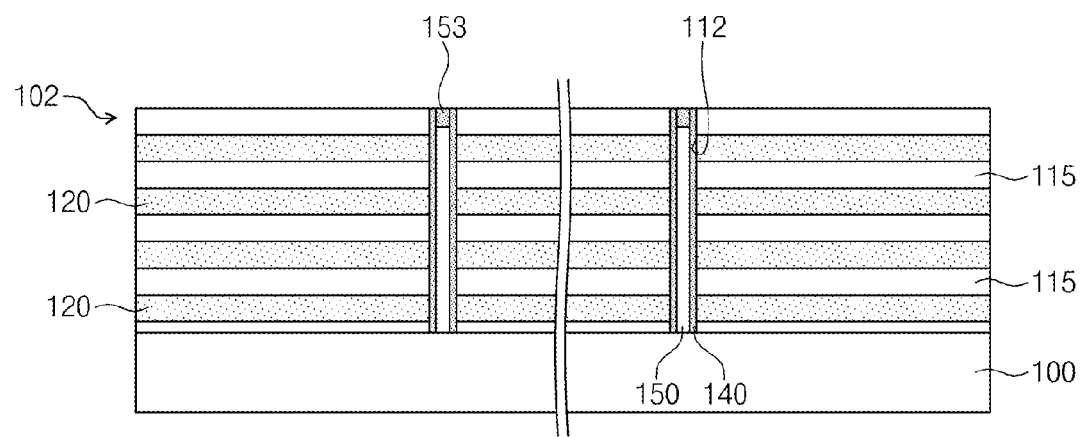
FIGS. 5A, 5B, 5C, 5D, 5E and 5F are cross-sectional views illustrating a method for fabricating a semiconductor memory device according to the inventive concept.

Referring to FIG. 5A, the mold insulating layers 115 and the mold sacrificial layers 120 are alternately stacked on the substrate 100 to form the mold stack 102. The mold stack 102 is anisotropically etched to form the channel hole 112 that penetrates the mold stack 102 and exposes the substrate 100. Subsequently, the memory layer 140 and the vertical channel 150 are formed in the channel hole 112. Then, the top portion of the vertical channel 150 may be doped with impurities to form the drain 153.

Figure 5B:
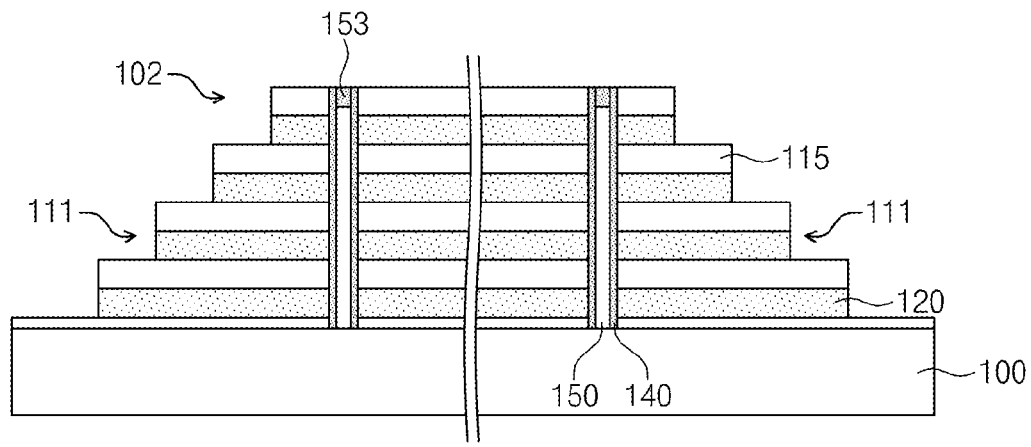

Referring to FIG. 5B, the mold stack 102 is patterned to form the staircase(s) 111. Therefore, the mold stack 102 may have a pyramid shape whose lateral width decreases along a direction away from the substrate 100.

Figure 5C:
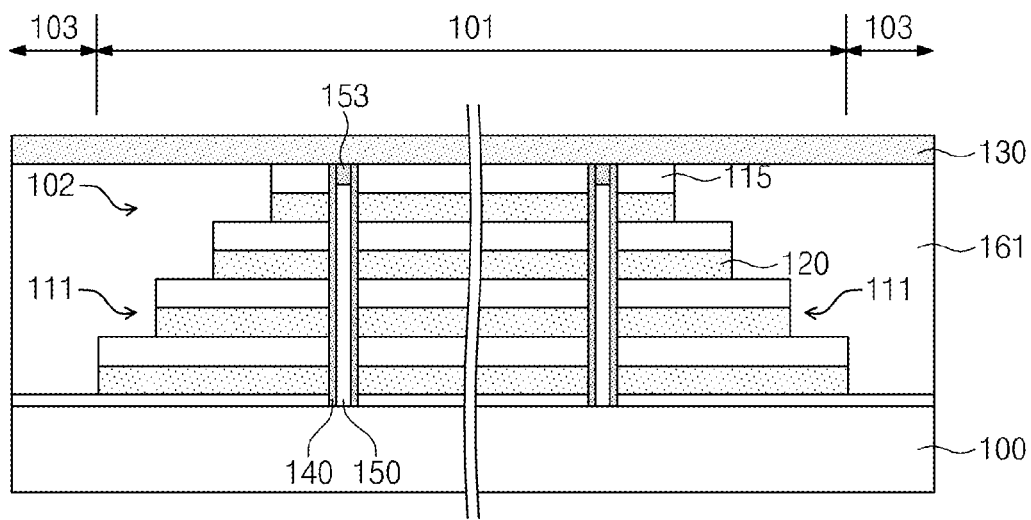

Referring to FIG. 5C, the stress buffer layer 130 is formed on the substrate 100 to cover the mold stack 102. Before the stress buffer layer 130 is formed, the dielectric capping layer 161 may be formed to cover the staircases 111. The stress buffer layer 130 may have the shape of a plate shape that covers the entire top surface of the substrate 100 including the cell region 101 and the peripheral region 103, and thus covers the uppermost one of the mold insulating layers 115 and the dielectric capping layer 161. The stress buffer layer 130 may comprise a silicon oxide layer (e.g., $SiO_2$), a silicon nitride layer (e.g., SiN, $Si_3N_4$), a silicon oxynitride layer (e.g., SiON) or any combination thereof.

Figure 5D:
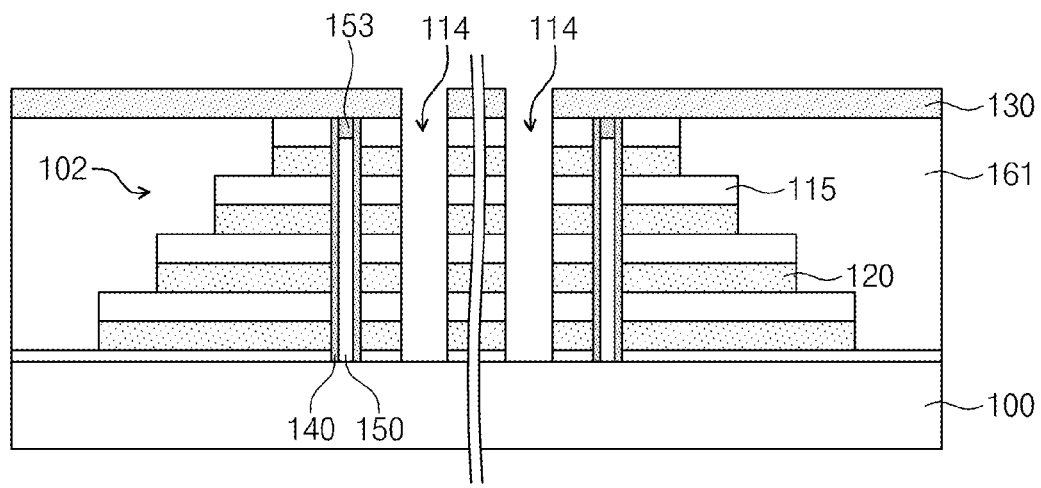

Referring to FIG. 5D, the word line cutout 114 is formed to penetrate the stress buffer layer 130 and the mold stack 102. The word line cutout 114 is formed between the adjacent vertical channels 150.

Figure 5E:
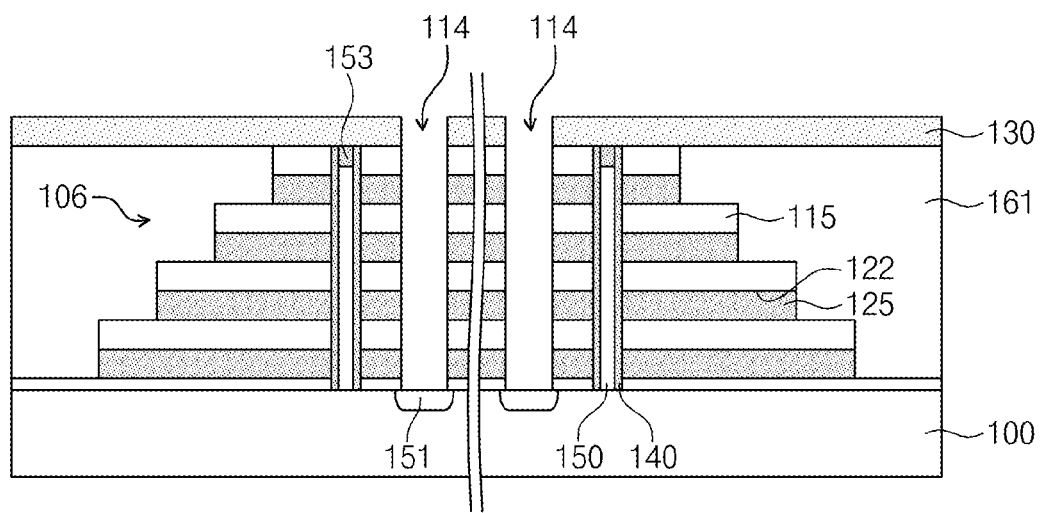

Referring to FIG. 5E, the mold sacrificial layers 120 are removed to form the spaces 122, and conductive material is deposited and etched to form the gates 125 filling the spaces 122. The substrate 100 exposed through the word line cutout 114 may be doped with impurities to form the common source 151. The stress buffer layer 130 may be left on the gate stack 106 or be removed together with the mold sacrificial layers 120.

Figure 5F:
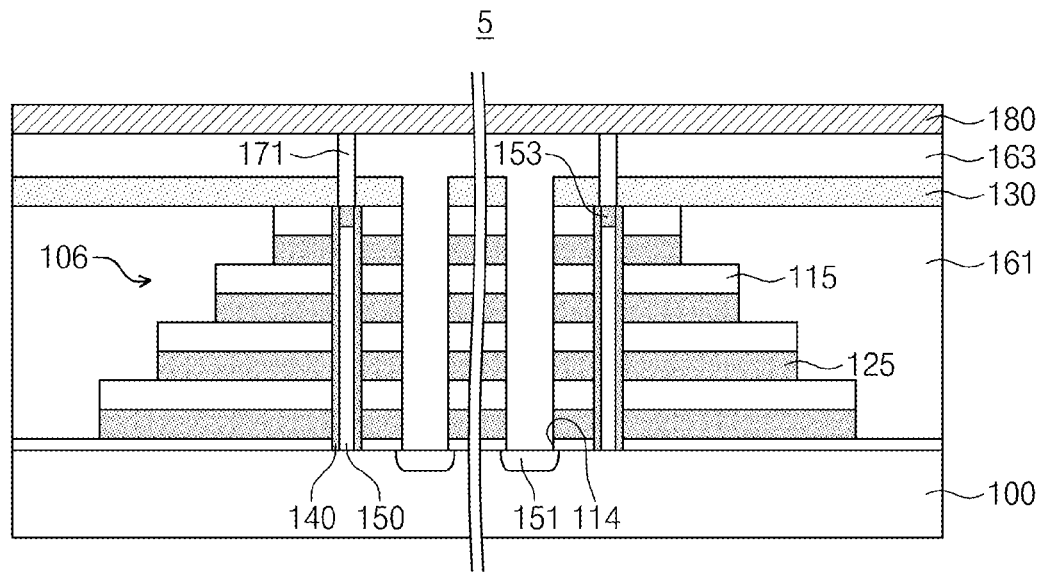

Referring to FIG. 5F, the interlayer dielectric layer 163 is formed on the dielectric capping layer 161 so as to cover the stress buffer layer 130 and fill the word line cutout 114, the bit line contact 171 contacting the drain 153 may be formed to penetrate the interlayer dielectric layer 163 and the stress buffer layer 130, and the bit line 180 may be formed on the interlayer dielectric layer 163 to be electrically connected to the bit line contact 171. Through the above processes, a semiconductor memory device 5, that comprises the stress buffer layer 130 having a plate shape and which covers the gate stack 106 as well as the capping layer 161 and the vertical channel 150 penetrating the gate stack 106, is fabricated. Alternatively, in the case in which the stress buffer layer 130 is removed together with the mold sacrificial layers 120, a semiconductor memory device 3 having features similar to that of FIG. 3C is fabricated.

Another method of fabricating a semiconductor memory device according to the inventive concepts is illustrated in FIGS. 6A to 6D.

Figure 6A:
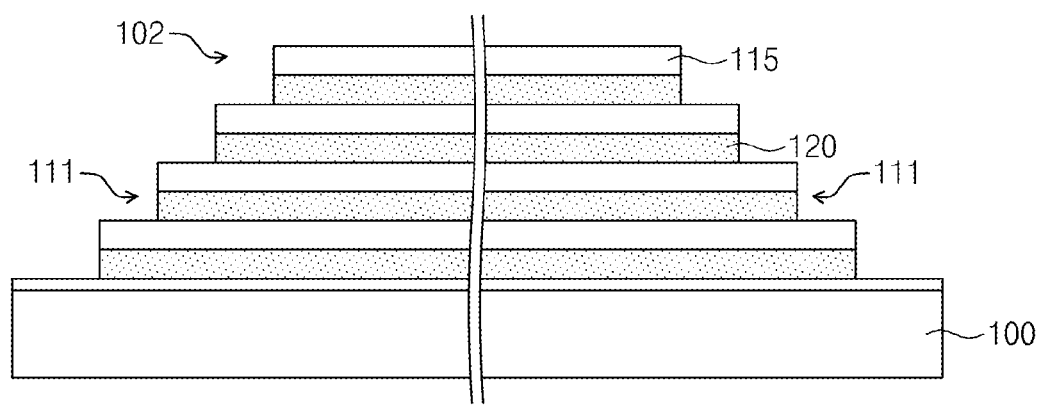
FIGS. 6A, 6B, 6C and 6D are cross-sectional views illustrating a method for fabricating a semiconductor memory device according to the inventive concept.

Referring to FIG. 6A, the mold insulating layers 115 and the mold sacrificial layers 120 are alternately stacked on the substrate 100 to form the mold stack 102. The mold stack 102 is patterned to form the staircases 111, in this example, at the sides of the mold stack 102.

Figure 6B:
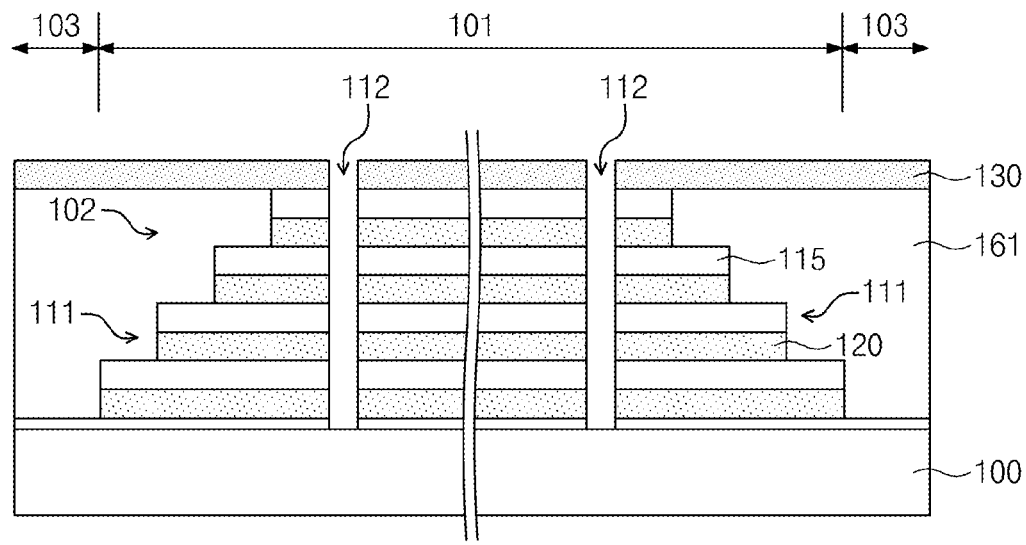

Referring to FIG. 6B, the dielectric capping layer 161 is formed to cover the staircases 111. Then the stress buffer layer 130 is formed on the substrate 100 to cover the mold stack 102, and the channel hole 112 is formed to penetrate the stress buffer layer 130 and the mold stack 102. The stress buffer layer 130 may have the shape of a plate to cover the dielectric capping layer 161 and the uppermost one of the mold insulating layers 115. Also, the stress buffer layer 130 may comprise a silicon oxide layer (e.g., $SiO_2$), a silicon nitride layer (e.g., SiN, $Si_3N_4$), a silicon oxynitride layer (e.g., SiON), or any combination thereof.

Figure 6C:
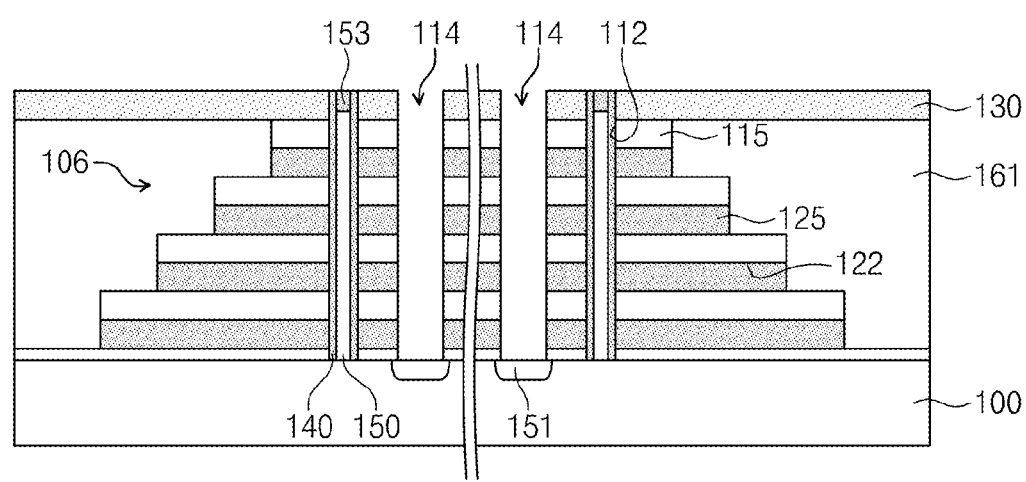

Referring to FIG. 6C, the vertical channel 150 enclosed by the memory layer 140 is formed in the channel hole 112, the word line cutout 114 is formed to penetrate the stress buffer layer 130 and the mold stack 102, the mold sacrificial layers 120 is removed to form the spaces 122, and the spaces 122 are filled with the gates 125 to form the gate stack 106. The top portion of the vertical channel 150 may be defined as the drain 153. The substrate 100 exposed through the word line cutout 114 may be doped with impurities to form the common source 151. The stress buffer layer 130 may be left atop the gate stack 106 or be removed together with the mold sacrificial layers 120.

Figure 6D:
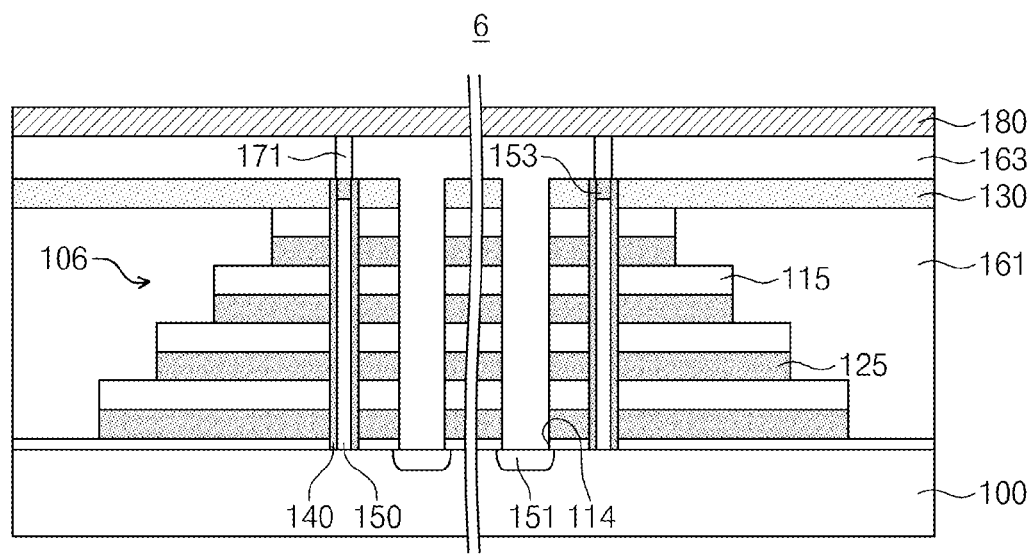

Referring to FIG. 6D, the interlayer dielectric layer 163 is formed on the stress buffer layer 130 to fill the world line cutout 114, the bit line contact 171 contacting the drain 153 is formed to penetrate the interlayer dielectric layer 163, and the bit line 180 is formed on the interlayer dielectric layer 163 to be connected to the bit line contact 171. Through the above processes, a semiconductor memory device 6, that comprises the stress buffer layer 130 having the shape of a plate and which covers the top surface of the gate stack 106 and the dielectric capping layer 161, and the vertical channel 150 penetrating the stress buffer layer 130 as well as the gate stack 106, is fabricated. Alternatively, in the case in which the stress buffer layer 130 is removed together with the mold sacrificial layers 120, a semiconductor memory device 3 having features similar to those of FIG. 3C is fabricated.

Another method for fabricating a semiconductor memory device according to the inventive concept is illustrated in FIGS. 7A to 7E.

Figure 7A:
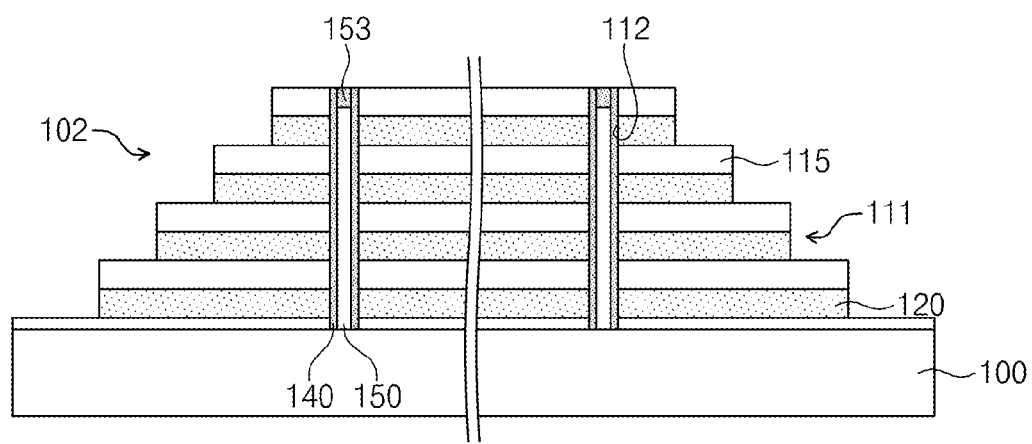
FIGS. 7A, 7B, 7C, 7D and 7E are cross-sectional views illustrating a method for fabricating a semiconductor memory device according to the inventive concept.

Referring to FIG. 7A, the mold insulating layers 115 and the mold sacrificial layers 120 are alternately stacked on the substrate 100 to form the mold stack 102, the channel hole 112 is formed to penetrate the mold stack 102, and the memory layer 140 and the vertical channel 150 are formed in the channel hole 112. The top portion of the vertical channel 150 may be doped with impurities to form the drain 153. Subsequently, the mold stack 102 is patterned to form the staircases 111 at the sides of the mold stack 102.

Figure 7B:
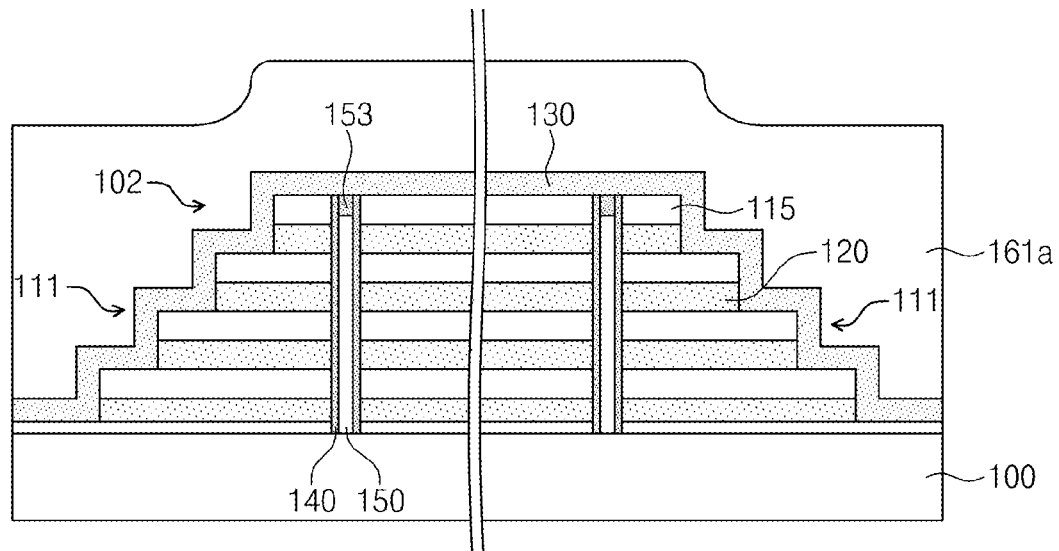

Referring to FIG. 7B, the stress buffer layer 130 is formed to cover the mold stack 102, and dielectric layer 161a is formed to cover the stress buffer layer 130. The stress buffer layer 130 includes a first portion having the shape of a plate covering the top surface of the mold stack 102 and a second portion having the shape of at least one staircase covering the sides of the mold stack 102. The stress buffer layer 130 may comprise an insulting material having an etch selectivity with respect to the mold sacrificial layers 120. For example, the mold sacrificial layers 120 may each comprise a silicon nitride layer (e.g., SiN, Si3N$_4$) which can be removed by a phosphoric acid solution, and the stress buffer layer 130 may be a single layer or a composite (laminate) comprising a silicon oxide layer (e.g., SiO$_2$), a silicon oxynitride layer (e.g., SiON), or a combination thereof which cannot be removed by the phosphoric acid.

Figure 7C:
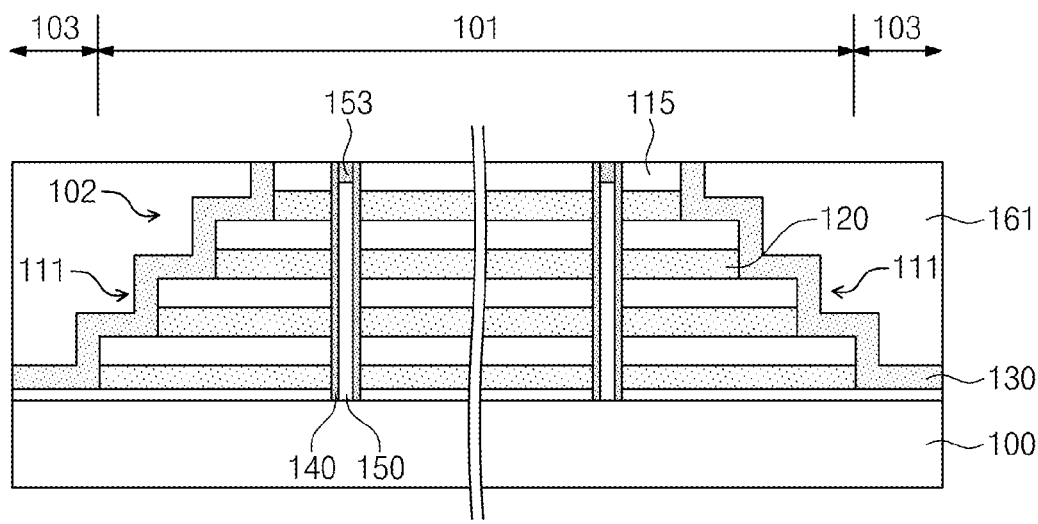

Referring to FIG. 7C, the dielectric layer 161a is planarized by a chemical mechanical polishing process, for example, to form the dielectric capping layer 161. When the dielectric layer 161a is planarized, the first portion of the stress buffer layer 130 disposed on the cell region 101 may be polished to expose the uppermost one of the mold insulating layers 115. Due to the polishing process, the stress buffer layer 130 may have that shape of at least one staircase that covers the sides of the mold stack 102, i.e., the staircase(s) 111 of the mold stack 102.

Figure 7D:
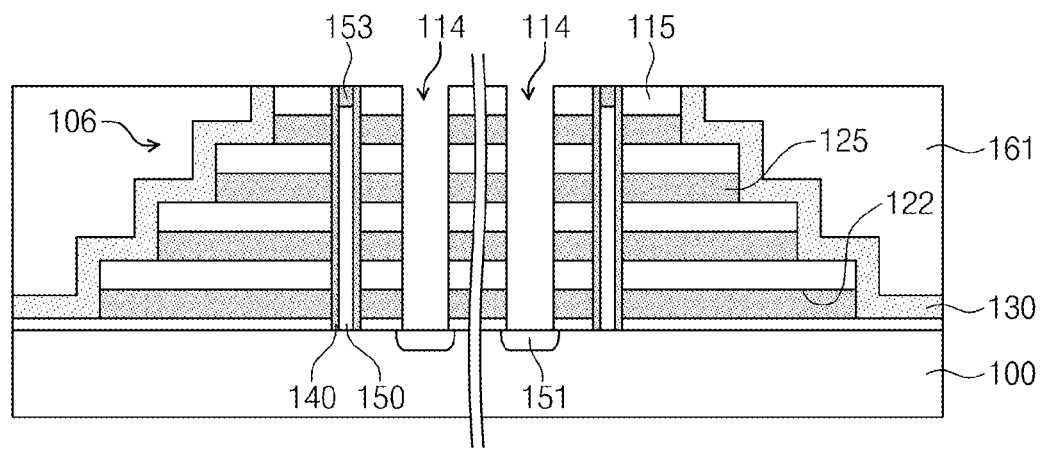

Referring to FIG. 7D, the word line cutout 114 is formed to penetrate the mold stack 102, the mold sacrificial layers 120 may be removed by an etchant (e.g., phosphoric acid) to form the spaces 122, and the spaces 122 may be filled with the gates 125, thereby forming the gate stack 106. The substrate 100 exposed through the word line cutout 114 may be doped with impurities to form the common source 151. The stress buffer layer 130 is not be removed by the phosphoric acid.

Figure 7E:
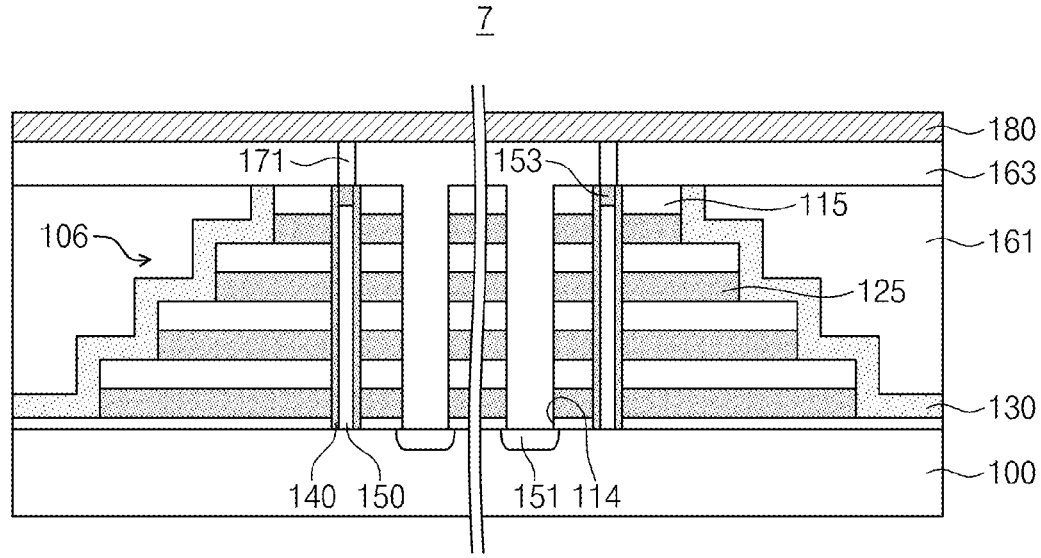

Referring to FIG. 7E, the interlayer dielectric layer 163 filling the word line cutout 114 is formed on the gate stack 106 and the capping layer 161, the bit line contact 171 contacting the drain 153 is formed to penetrate the interlayer dielectric layer 163, and the bit line 180 is formed on the interlayer dielectric layer 163 to be connected to the bit line contact 171. Through the above processes, a semiconductor memory device 7, comprising stress buffer layer 130 having the shape of at least one staircase which covers the sides of the gate stack 106, and the vertical channel 150 which penetrates the gate stack 106, is fabricated.

Figure 8A:
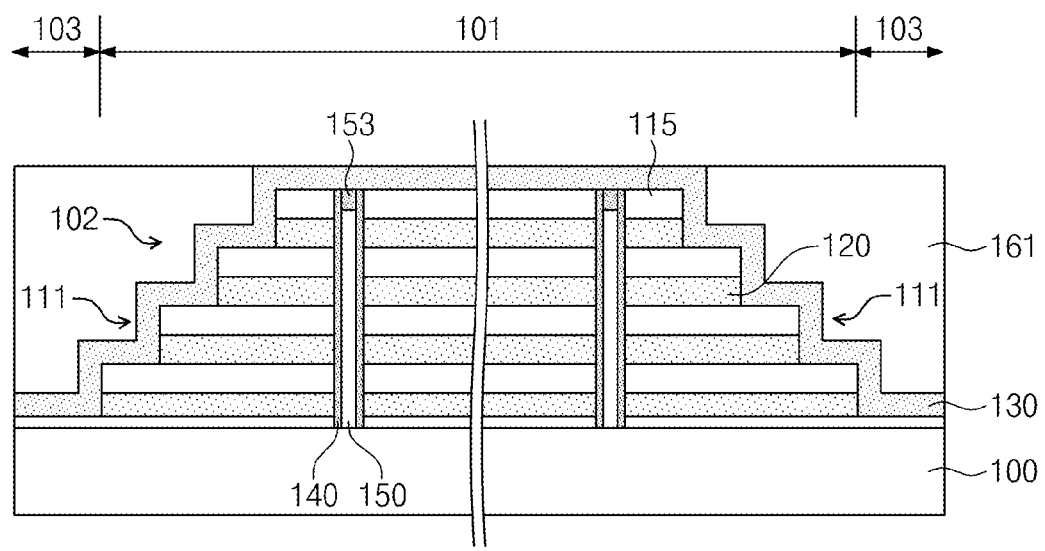
FIGS. 8A and 8B are cross-sectional views illustrating a method for fabricating a semiconductor memory device according to the inventive concept.
Figure 8B:
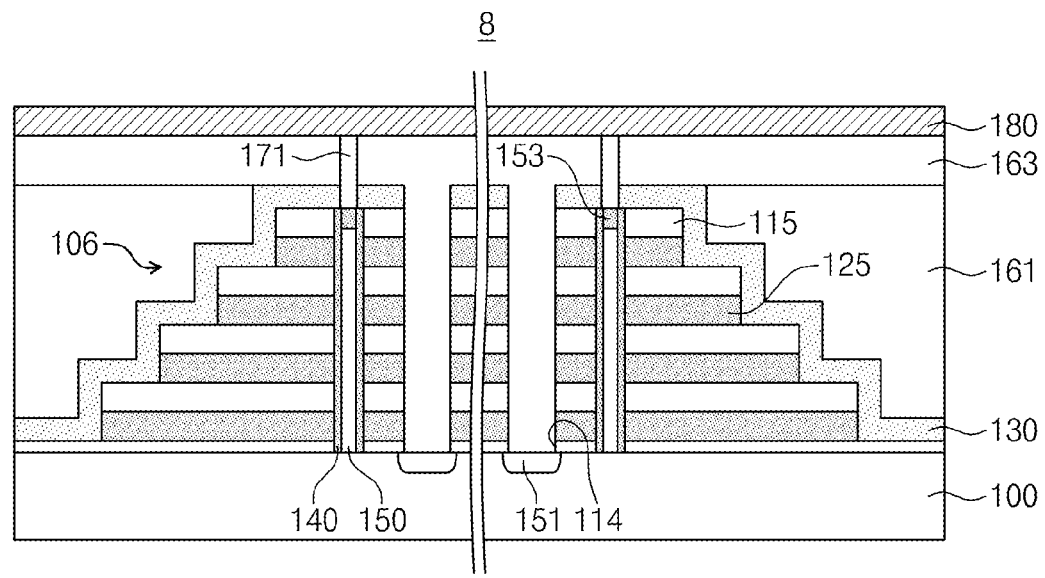

Still another method for fabricating a semiconductor memory device according to inventive concept is illustrated in FIGS. 8A and 8B.

Referring to FIG. 8A, the dielectric layer 161a may be polished to expose the stress buffer layer 130, as an alternative to the process described with reference to FIG. 7C. Consequently, the stress buffer layer 130 may entirely cover the substrate 100 including the cell region 101 and the peripheral region 103, and the dielectric capping layer 161 may be formed to expose a portion of the stress buffer layer 130 on the cell region 101. The stress buffer layer 130 has a plate-shaped portion covering the top surface of the mold stack 102 and a staircase-shaped portion covering at least one side of the mold stack 102.

Referring to FIG. 8B, processes similar to those described with reference to FIGS. 7D and 7E are performed to fabricate a semiconductor memory device 8 that comprises the stress buffer layer 130 covering the sides and top surface of the gate stack 106.

Another method of fabricating a semiconductor memory device according to the inventive concept is illustrated in FIGS. 9A to 9D.

Figure 9A:
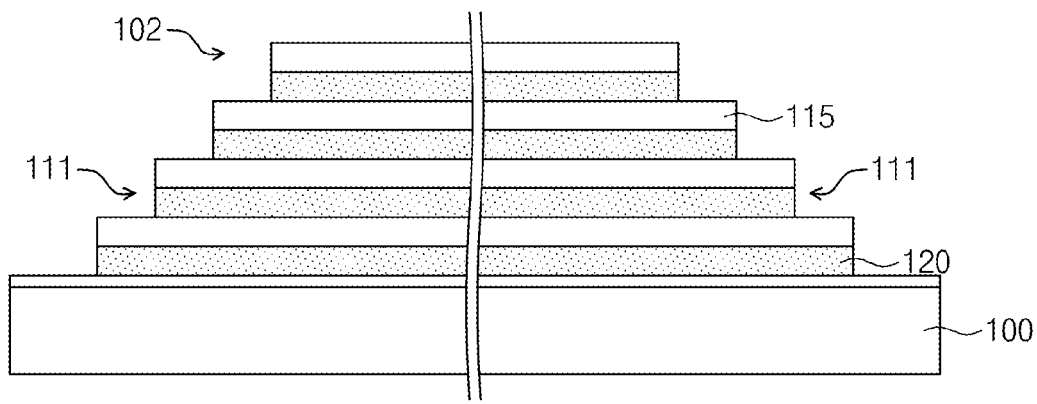
FIGS. 9A, 9B, 9C and 9D are cross-sectional views illustrating a method for fabricating a semiconductor memory device according to the inventive concept.

Referring to FIG. 9A, the mold insulating layers 115 and the mold sacrificial layers 120 are alternately stacked on the substrate 100 to form the mold stack 102. Subsequently, the mold stack 102 is patterned to form the staircases 111 at the sides of the mold stack 102.

Figure 9B:
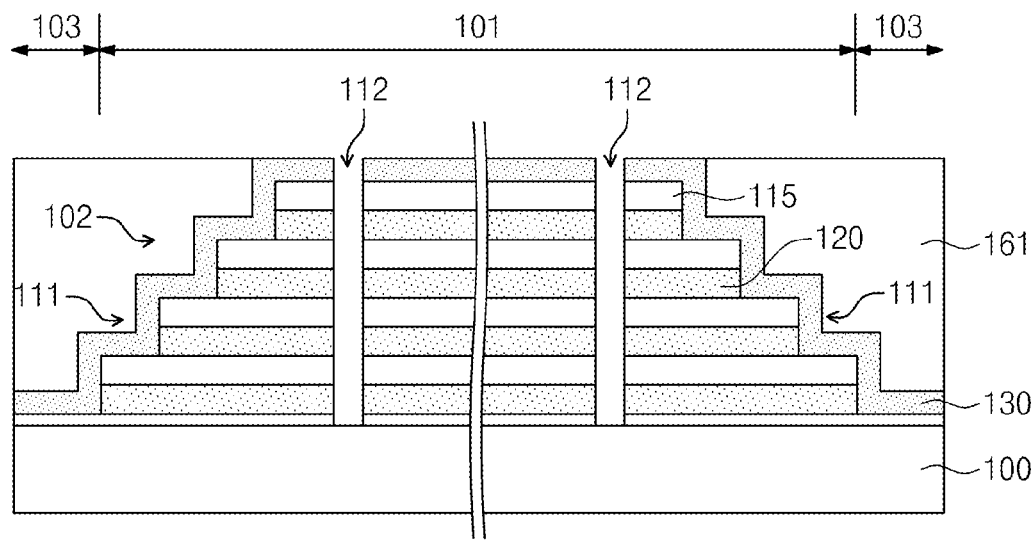

Referring to FIG. 9B, the stress buffer layer 130 is formed to cover the mold stack 102, the dielectric capping layer 161 is formed to cover the stress buffer layer 130, and channel hole 112 is formed to penetrate the stress buffer layer 130 and the mold stack 102. The stress buffer layer 130 may entirely cover the substrate 100 including the cell region 101 and the peripheral region 103. The dielectric capping layer 161 may partially cover the stress buffer layer 130 such that a portion of the stress buffer layer 130 is exposed. The stress buffer layer 130 may comprise a silicon oxide layer (e.g., SiO$_2$), a silicon oxynitride layer (e.g., SiON), or a combination thereof which cannot be removed by a phosphoric acid, for reason similar to those explained with reference to FIG. 7B.

Figure 9C:
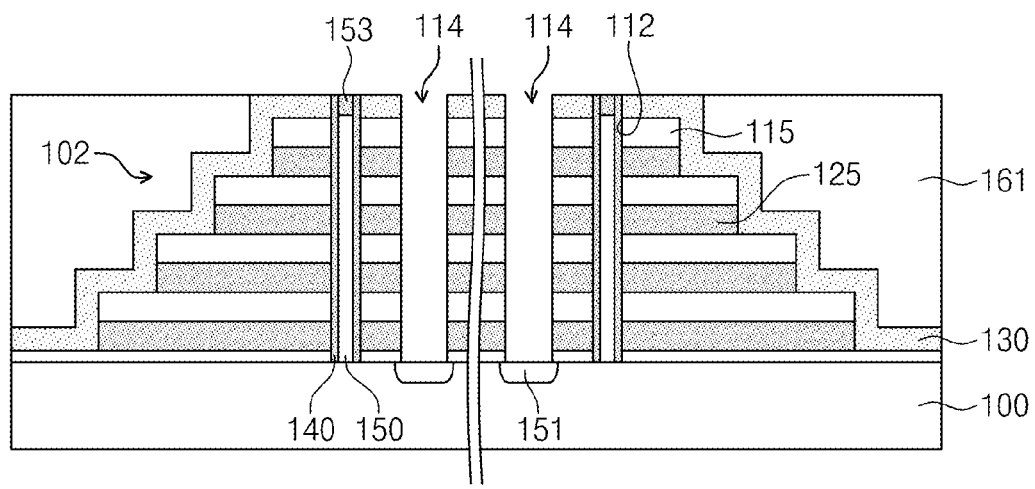

Referring to FIG. 9C, the vertical channel 150 enclosed by the memory layer 140 is formed in the channel hole 112, the word line cutout 114 is formed, and the mold sacrificial layers 120 are replaced by the gates 125 such that the gate stack 106 is formed, and the substrate 100 exposed through the word line cutout 114 may be doped with impurities to form the common source 151. The vertical channel 150 may penetrate the gate stack 106 and further penetrate the stress buffer layer 130.

Figure 9D:
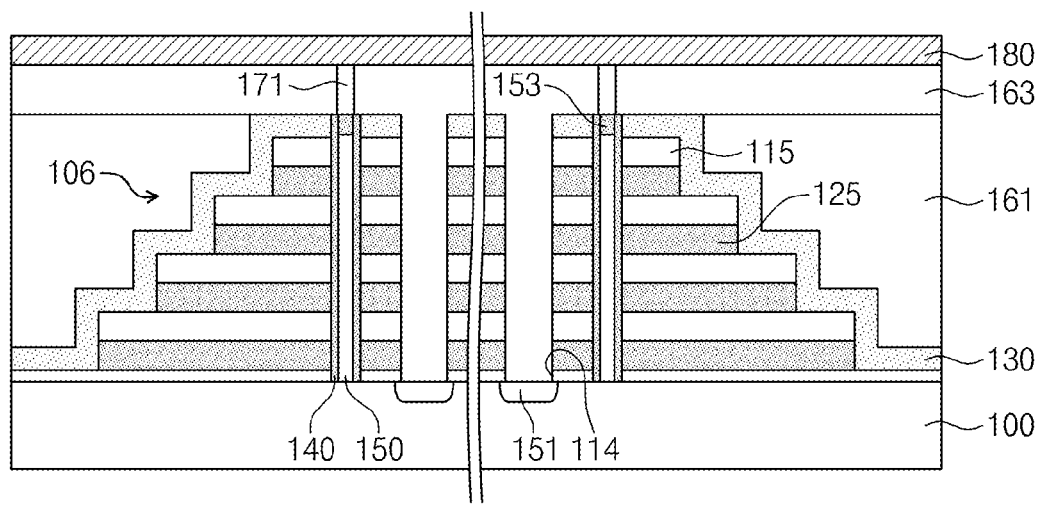

Referring to FIG. 9D, the interlayer dielectric layer 163 filling the word line cutout 114 is formed on the gate stack 106 and the capping layer 161, the bit line contact 171 contacting the drain 153 is formed to penetrate the interlayer dielectric layer 163, and the bit line 180 is formed on the interlayer dielectric layer 163 to be connected to the bit line contact 171. Through the above processes, a semiconductor memory device 9, comprising the stress buffer layer 130 covering the sides and top surface of the gate stack 106 and the vertical channel 150 penetrating the stress buffer layer 130 as well as the gate stack 106, is fabricated.

Another method for fabricating a semiconductor memory device according to the inventive concept is illustrated in FIGS. 10A to 10E.

Figure 10A:
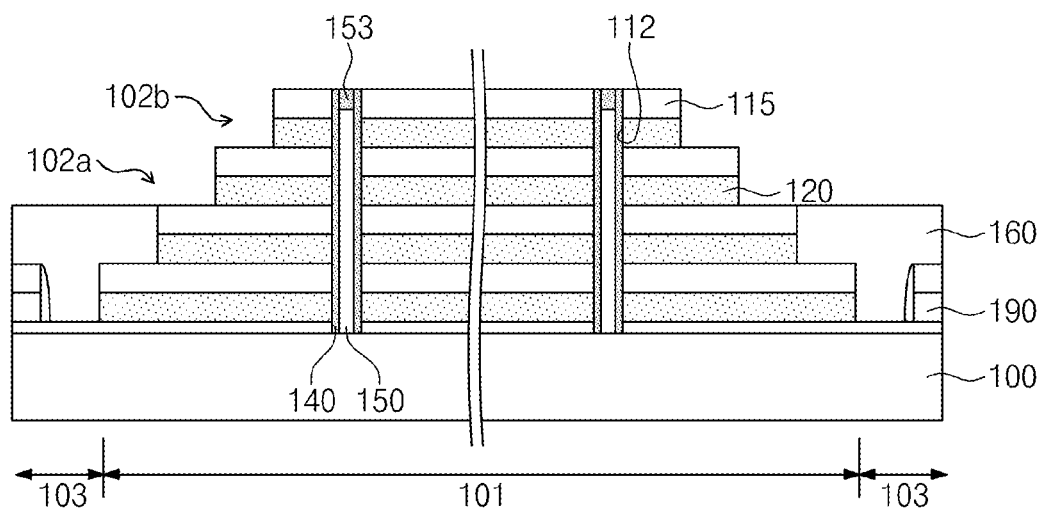
FIGS. 10A, 10B, 10C, 10D and 10E are cross-sectional views illustrating a method for fabricating a semiconductor memory device according to the inventive concept.

Referring to FIG. 10A, a first mold stack 102a having at least one side thereof in the shape of a staircase is formed on the substrate 100, and a second mold stack 102b having at least one side in the shape of a staircase shape is formed on the first mold stack 102b. The vertical channel 150 enclosed by the memory layer 140 is formed in the channel hole 112 penetrating the first mold stack 102a and the second mold stack 102b. The top portion of the vertical channel 150 may be defined as the drain 153. In this embodiment, a lower dielectric capping layer 160 is formed to cover the peripheral region 103, including a peripheral circuit 190, before the second mold stack 102b is formed. The top surface of the lower dielectric capping layer 160 may be formed at the same level as, i.e., coplanar with, that of the first mold stack 102a.

More particularly, for example, at least one mold insulating layer 115 and at least one mold sacrificial layer 120 are stacked on the substrate 100 to form the first mold stack 102a, and a lower part of the channel hole 112 is formed to penetrate the first mold stack 102. A part of the memory layer 140 and a part of the vertical channel 150 are formed in the lower part of the channel hole 112 which penetrates the first mold stack 102a, and the first mold stack 102a is patterned to form staircases at sides of the first mold stack 102a. Subsequently, at least one mold insulating layer 115 and at least one mold sacrificial layer 120 are stacked on the first mold stack 102a and the lower dielectric capping layer 160 to form the second stack 102b, and an upper part of the channel hole 112 is formed to penetrate the second mold stack 102b. The upper part of the channel hole 112 is vertically aligned with the lower part of the channel hole 112. Another part of the memory layer 140 and another part of the vertical channel 150 are formed in the upper part of the channel hole 112 which penetrates the second mold stack 102b, and the second mold stack 102b is patterned to form staircases at the sides of the second mold stack 102b.

Figure 10B:
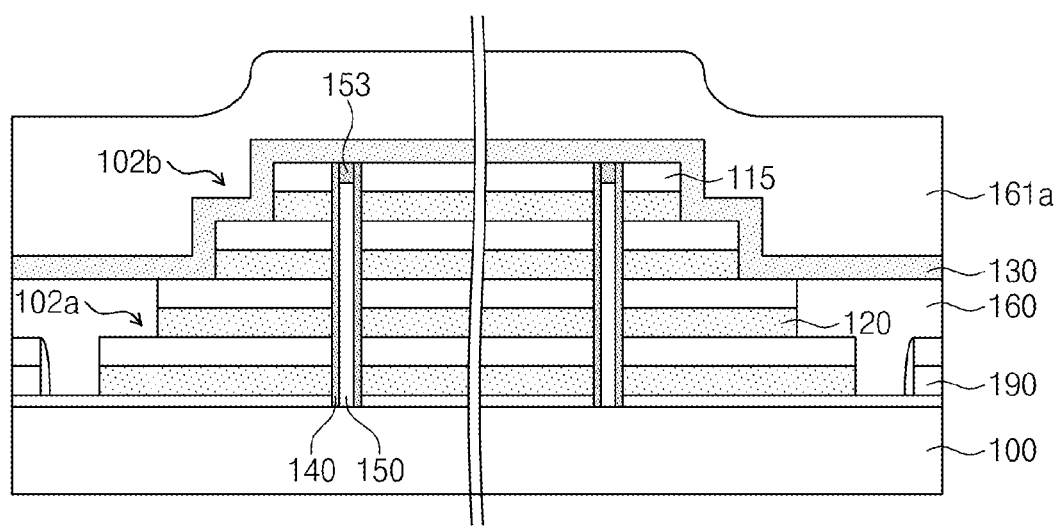

Referring to FIG. 10B, the stress buffer layer 130 is formed to cover a top surface and the sides of the second mold stack 102b and the lower dielectric capping layer 160, and the dielectric layer 161a is formed to cover the stress buffer layer 130. The stress buffer layer 130 may comprise a silicon oxide layer (e.g., SiO$_2$), a silicon oxynitride layer (e.g., SiON), or a combination thereof which cannot be removed by phosphoric acid.

Figure 10C:
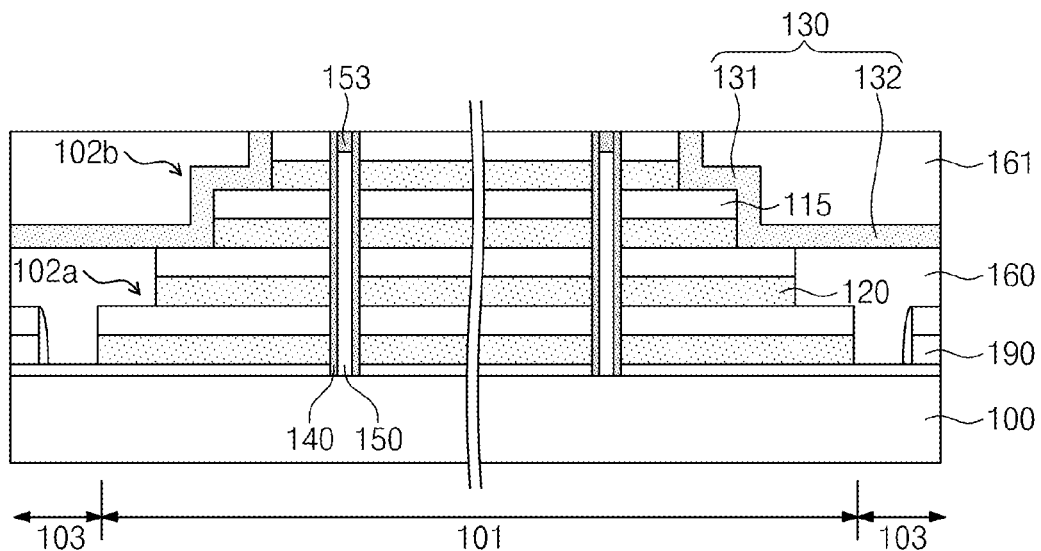

Referring to FIG. 10C, the dielectric layer 161a is planarized by, for example, a chemical mechanical polishing process, to form the dielectric capping layer 161 (referred to hereinafter as an upper dielectric capping layer). In particular, when the dielectric layer 161a is planarized, the stress buffer layer 130 may be polished on the cell region 101 to expose the uppermost of the mold insulating layers 115. Due to the polishing process, the stress buffer layer 130 may be divided so as to comprise a first buffer layer portion 131 having the shape of staircases that cover the sides of the second mold stack 102b and a second buffer layer portion 132 having the shape of a plate that covers the lower dielectric capping layer 160. The first buffer layer 131 portion is disposed on the cell region 101, and the second buffer layer portion 132 is disposed between the lower dielectric capping layer 160 and the upper dielectric capping layer 161 on the peripheral region 103.

Figure 10D:
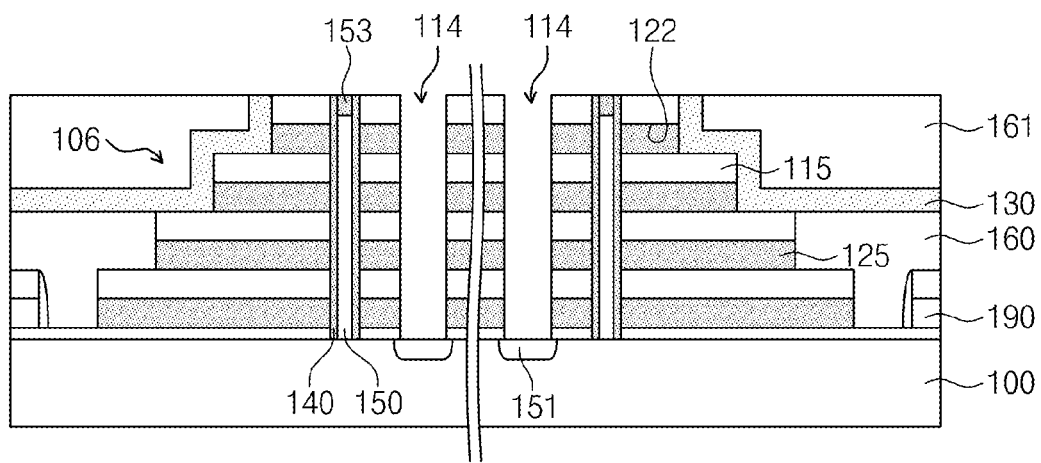

Referring to FIG. 10D, the word line cutout 114 is formed to penetrate the first mold stack 102a and the second mold stack 102b, the mold sacrificial layers 120 are removed by an etchant (e.g., phosphoric acid) to form the spaces 122, and the spaces 122 are filled with the gates 125 to form the gate stack 106. The substrate 100 exposed through the word line cutout 114 may be doped with impurities to form the common source 151. The stress buffer layer 130 is not be removed by the etchant (e.g., phosphoric acid) in this process.

Figure 10E:
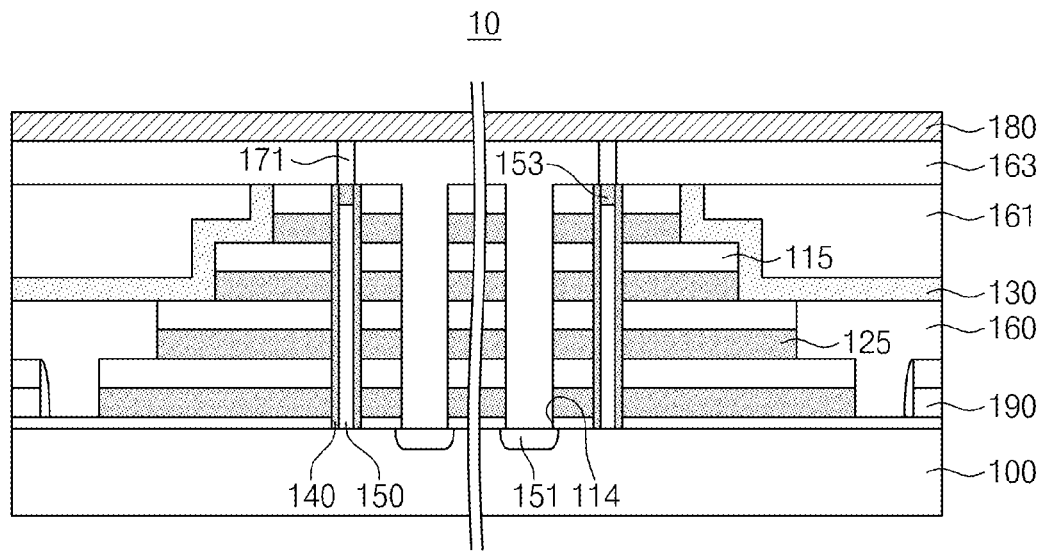

Referring to FIG. 10E, the interlayer dielectric layer 163 filling the word line cutout 114 is formed on the gate stack 106 and the upper dielectric capping layer 161, the bit line contact 171 contacting the drain 153 is formed to penetrate the interlayer dielectric layer 163, and the bit line 180 is formed on the interlayer dielectric layer 163 to be connected to the bit line contact 171. Through the above processes, a semiconductor memory device 10, comprising the stress buffer layer 130 covering an upper part only of the gate stack 106, the lower dielectric capping layer 160 and the vertical channel 150 penetrating the gate stack 106, is fabricated.

Figure 11A:
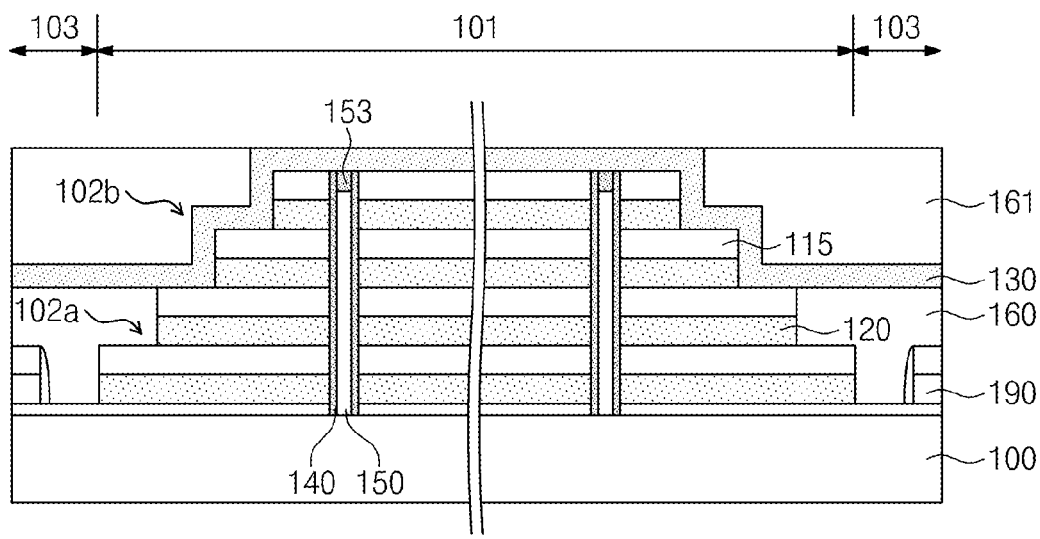
FIGS. 11A and 11B are cross-sectional views illustrating a method for fabricating a semiconductor memory device according to the inventive concept.
Figure 11B:
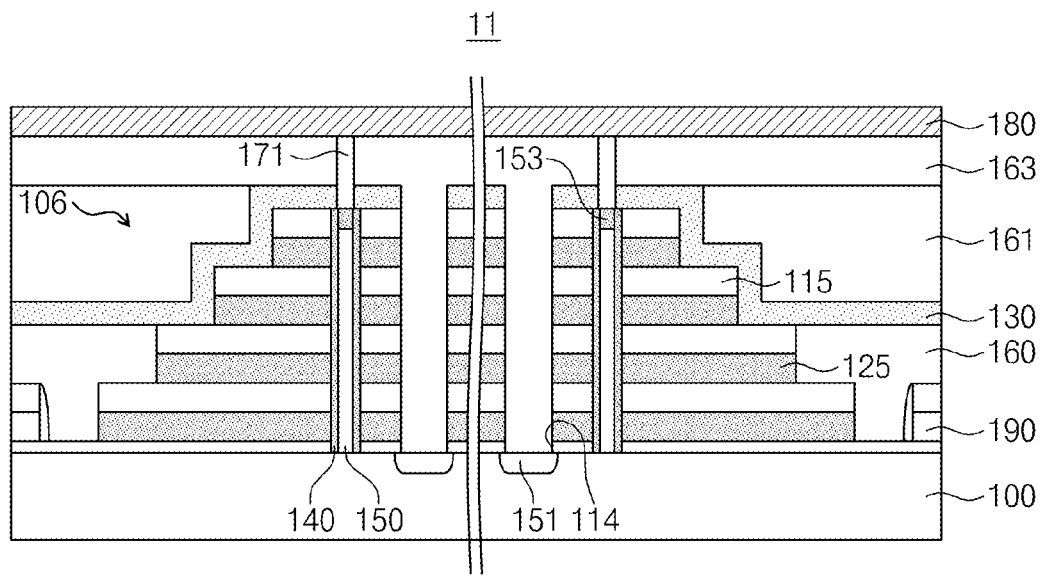

Still another method for fabricating a semiconductor memory device according to the inventive concept is illustrated by FIGS. 11A and 11B.

Referring to FIG. 11A, the dielectric layer 161a is polished to expose the stress buffer layer 130, as an alternative to the polishing process described with reference to FIG. 10C. That is, the capping layer 161 exposes a portion of the stress buffer layer 130 on the cell region 101. The stress buffer layer 130 may thus cover the top surface and sides of the upper mold stack 102b and the lower dielectric capping layer 160.

Referring to FIG. 11B, processes similar to those described with reference to FIGS. 10D and 10E are performed to fabricate a semiconductor memory device 11 that comprises the stress buffer layer 130 covering the upper portions of the sides and top surface of the gate stack 106 and the lower dielectric capping layer 160 and the vertical channel 150 penetrating the gate stack 106.

Another method for fabricating a semiconductor memory device according to the inventive concept is illustrated by FIGS. 12A to 12D.

Figure 12A:
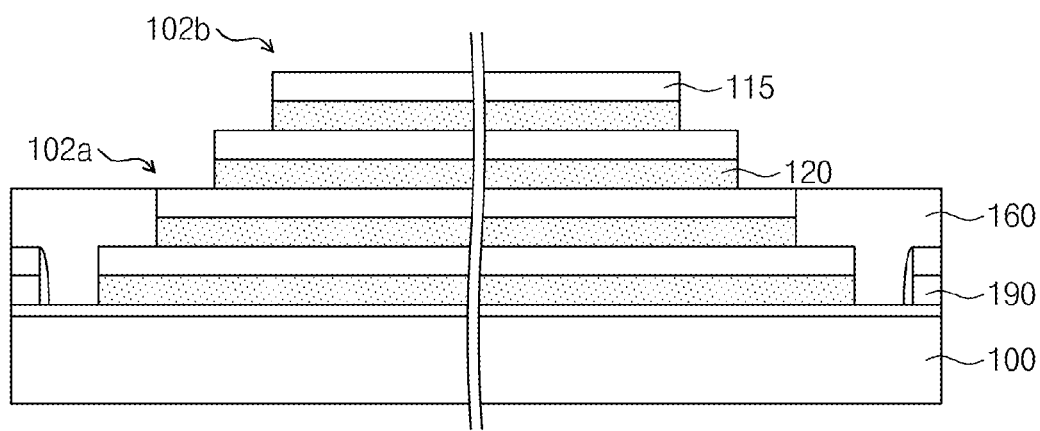
FIGS. 12A, 12B, 12C and 12D are cross-sectional views illustrating a method for fabricating a semiconductor memory device according to the inventive concepts.

Referring to FIG. 12A, the first mold stack 102a is formed on the substrate 100, and the second mold stack 102b is formed on the first mold stack 102a to have a staircase shape. Before the second mold stack 102b is formed, the lower dielectric capping layer 160 is formed to cover the peripheral region 103 including the peripheral circuit 190. The upper surface of the lower dielectric capping layer 160 may be disposed at the same level as the top surface of the first mold stack 102a.

Figure 12B:
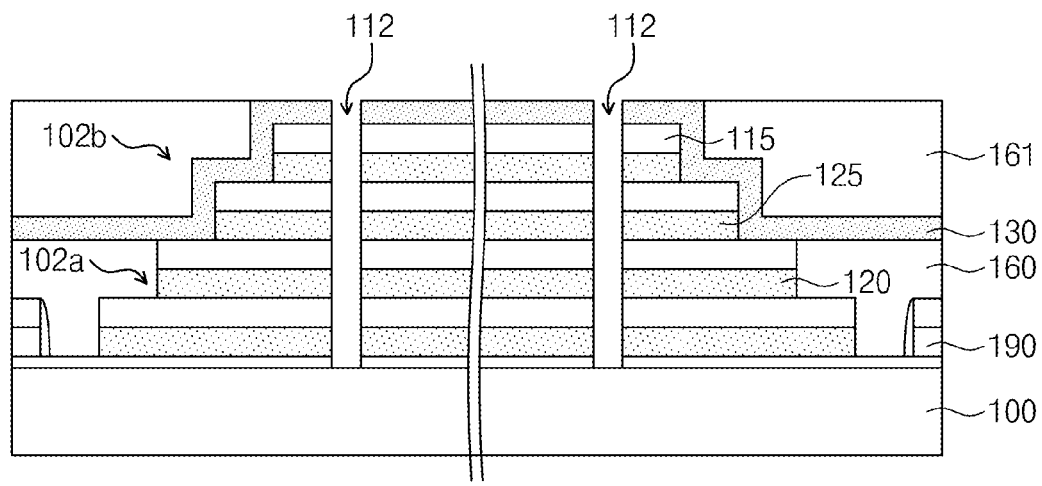

Referring to FIG. 12B, the stress buffer layer 130 is formed to cover a top surface and sides of the second mold stack 102b and the lower dielectric capping layer 160, and the upper dielectric layer 161 is formed to cover the stress buffer layer 130. The channel hole 112 is formed to penetrate the first mold stack 102a and the second mold stack 102b. The stress buffer layer 130 may have one portion in the shape of staircases covering the top surface and sides of the second mold stack 102b on the cell region 101 and another portion in the shape of a plate covering the lower dielectric capping layer 160 on the peripheral region 103. The upper dielectric capping layer 161 may leave the uppermost portion of the stress buffer layer 130 on the cell region 101 exposed. The stress buffer layer 130 may comprise a silicon oxide layer (e.g., SiO$_2$), a silicon oxynitride layer (e.g., SiON), or a combination thereof which cannot be removed by phosphoric acid, for reasons similar to those described with reference to as FIG. 10B.

Figure 12C:
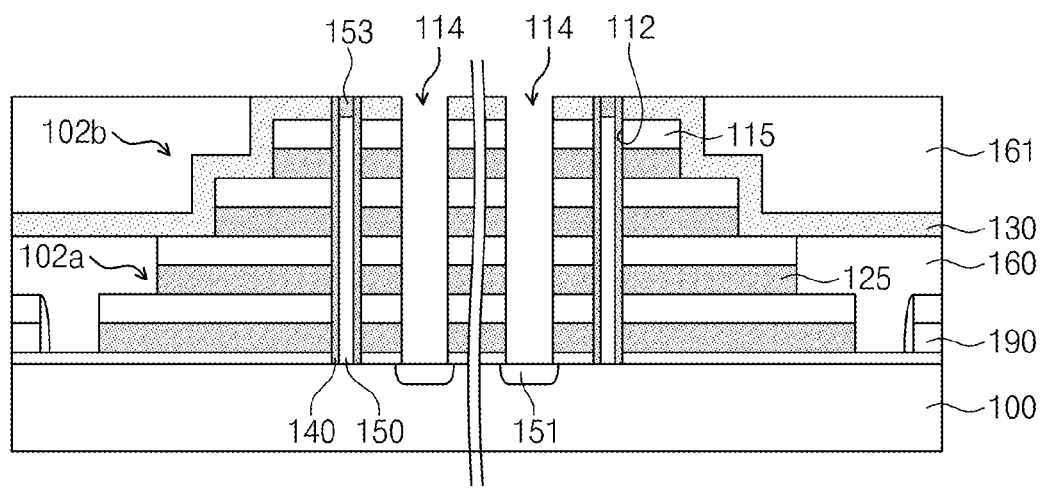

Referring to FIG. 12C, the vertical channel 150 enclosed by the memory layer 140 is formed in the channel hole 112, the word line cutout 114 is formed, and the mold sacrificial layers 120 are replaced by the gates 125 such that the gate stack 106 is formed, and the substrate 100 exposed through the word line cutout 114 may be doped with impurities to form the common source 151. The vertical channel 150 may penetrate the gate stack 106 and further penetrate the stress buffer layer 130.

Figure 12D:
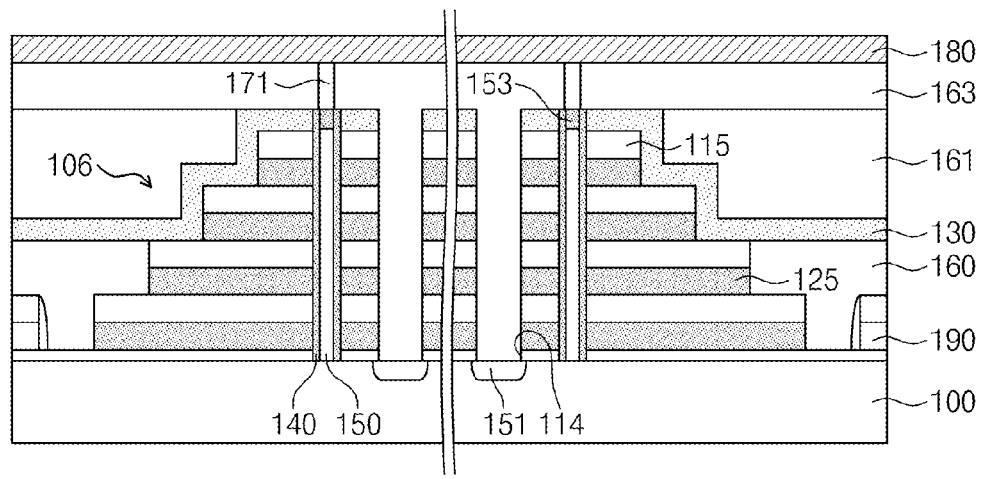

Referring to FIG. 12D, the interlayer dielectric layer 163 filling the word line cutout 114 is formed on the gate stack 106 and the upper dielectric capping layer 161, the bit line contact 171 contacting the drain 153 are formed to penetrate the interlayer dielectric layer 163, and the bit line 180 is formed on the interlayer dielectric layer 163 to be connected to the bit line contact 171. Through the above processes, a semiconductor memory device 12, comprising the stress buffer layer 130 covering upper side portions and the top surface of the gate stack 106 and the lower dielectric capping layer 160 and the vertical channel 150 penetrating the stress buffer layer 130 as well as the gate stack 106, is fabricated.

Another embodiment of a method for fabricating a semiconductor memory device according to the inventive concepts is illustrated in FIGS. 13A to 13D.

Referring to FIG. 13A, a plurality of mold insulating layers 215 and a plurality of gates 225 are alternately stacked on a substrate 200 to form a gate stack 206, and a channel hole 212 is formed to penetrate the gate stack 206 and expose the substrate 200. The gate stack 206 may be anisotropically etched to form the channel hole 212. A stress buffer layer 230 is formed on the gate stack 206 to prevent or reduce a warping of the substrate 200 during the etching process for forming the channel hole 212. That is, in this example, the stress buffer layer 230 is formed before the channel hole 212.

The substrate 200 may comprise a semiconductor substrate such as a silicon wafer doped with impurities so as to be of a first conductive type (e.g., p-type). Before the gate stack 206 is formed, the substrate 200 may be doped with impurities to form a common source 251 of a second conductive type (e.g., n-type). The mold insulating layers 215 may each comprise a silicon oxide layer or a silicon nitride layer, and the gates 225 may comprise a conductor such as doped polysilicon or a metal.

The stress buffer layer 230 may comprise a silicon oxide layer (e.g., $SiO_2$), a silicon nitride layer (e.g., SiN, $Si_3N_4$), a silicon oxynitride layer (e.g., SiON), a polysilicon layer, a metal layer, or any combination thereof. The stress buffer layer 230 may have the shape of a plate covering the substrate 200.

Referring to FIG. 13B, a vertical channel 250 is formed in the channel hole 212 as enclosed by a memory layer 240. Also, the stress buffer layer 230 and the gate stack 206 are patterned to form a staircase 211 in at least one side of the gate stack 206. A top portion of the vertical channel 250 may be doped with impurities to form a drain 253 of the second conductive type (e.g., n-type).

The staircase 211 may be formed by repeatedly trimming an etching mask formed on the stress buffer layer 230 and performing an anisotropic etching process on the gate stack 206. When the gate stack 206 is etched, the substrate 200 has the potential to be bent due to stress. The stress buffer layer 230 may prevent or otherwise inhibit warping of the substrate 200 due to the stress. The stress buffer layer 230 may be patterned together with the gate stack 206 to cover an uppermost one of the mold insulating layers 215.

The memory layer 240 may comprise a tunnel insulation layer, a trap insulation layer and a blocking insulation layer. Alternatively, the memory layer 240 may comprise a transitional metal oxide layer. An end portion of the gate 225 may define a pad 225p which is not covered with a gate 225, and the pad 225p contacts the word line contact 274 which is electrically connected to the metal line 294 as illustrated in FIG. 1B.

Referring to FIG. 13C, a dielectric capping layer 261 is formed to cover the staircases 211 of the gate stack 206. The dielectric capping layer 261 is formed by depositing and planarizing silicon oxide to thereby exposing the stress buffer layer 230. Also, an uppermost one of the mold insulating layers 215 and the gates 225 are patterned to form a slit 213. The stress buffer layer 230 may prevent or otherwise inhibit warping of the substrate 200 due to stress which can be produced when the slit 213 is formed. An uppermost one of the plate-shaped gates 225 is thus divided by the slit 213 into a plurality of linear sections.

Referring to FIG. 13D, a bit line 280 is formed to be electrically connected to the vertical channel 250. For example, an interlayer dielectric layer 263 filling the slit 213 is formed on the dielectric capping layer 216 and the stress buffer layer 230, a bit line contact 271 contacting the drain 253 is formed to penetrate the interlayer dielectric layer 263, and the bit line 280 is formed on the interlayer dielectric layer 263 to be connected to the bit line contact 271. The pad 225p may contact the word line contact 274 which is electrically connected to the metal line 294 as illustrated in FIG. 1B. The metal line 294 may be formed on the interlayer dielectric layer 263.

Through above the processes, a semiconductor memory device 13 that comprises the stress buffer layer 230 covering the uppermost one of the mold insulating layers 215 and the vertical channel 250 penetrating the stress buffer layer 230 as well as the gate stack 206, is fabricated.

A lowermost one of the gates 225 may constitute a ground selection line GSL, an uppermost one of the gates 225 may constitute a string selection line SSL, and intermediate gates 225 may constitute word lines WL as illustrated in FIG. 1B.

In case in which the memory layer 240 comprises the tunnel insulation layer, the trap insulation layer and the blocking insulation layer, the semiconductor memory device 13 may be a NAND Flash memory device. In the case in which the memory layer 240 comprises the transitional metal oxide layer, the semiconductor memory device 13 may be a resistive memory device (RRAM).

Another method for fabricating a semiconductor memory device according to the inventive concept is illustrated in FIGS. 14A to 14D.

Figure 14A:
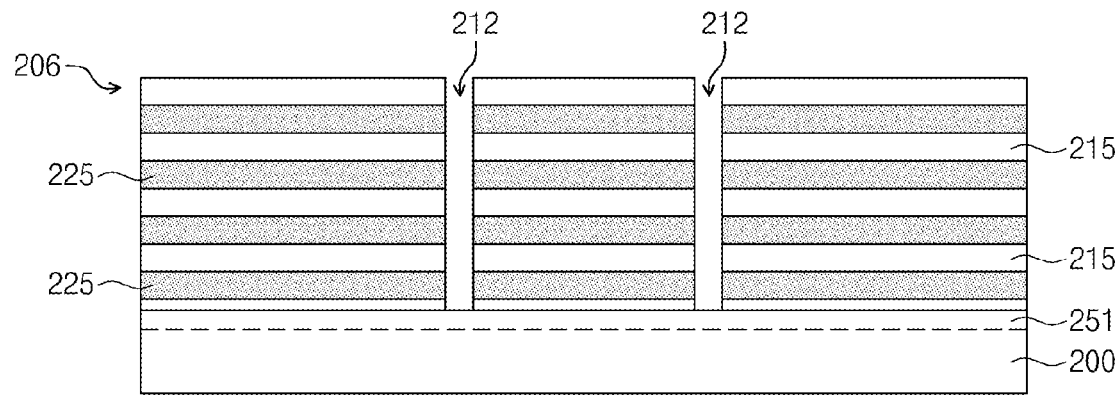
FIGS. 14A, 14B, 14C and 14D are cross-sectional views illustrating a method for fabricating a semiconductor memory device according to the inventive concept.

Referring to FIG. 14A, the mold insulating layers 215 and the gates 225 are alternately stacked to form the gate stack 206 on the substrate 200 including the common source 251 formed thereon. The gate stack 206 may be anisotropically etched to form the channel hole 211 exposing the substrate 200.

Figure 14B:
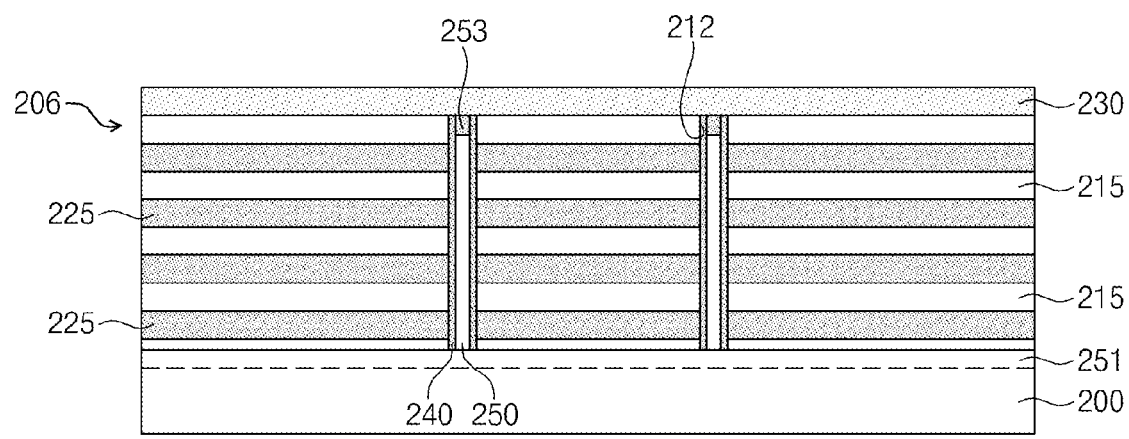

Referring to FIG. 14B, the vertical channel 250 enclosed by the memory layer 240 is formed in the channel hole 212. Subsequently, the stress buffer layer 230 is formed on the gate stack 206. The stress buffer layer 230 may have the shape of a plate and comprise a silicon oxide layer (e.g., $SiO_2$), a silicon nitride layer (e.g., SiN, $Si_3N_4$), a silicon oxynitride layer (e.g., SiON), a polysilicon layer, a metal layer, or any combination thereof.

Figure 14C:
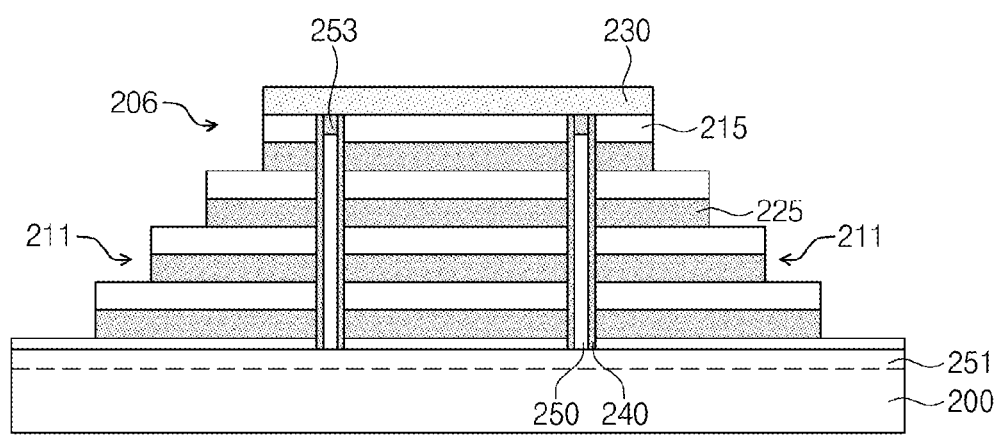

Referring to FIG. 14C, the stress buffer layer 230 and the gate stack 206 are patterned to form staircases 211 at the sides of the gate stack 206. The stress buffer layer 230 may prevent or otherwise inhibit warping of the substrate 200 due to the etching process for forming the staircases 211. The stress buffer layer 230 may be patterned together with the gate stack 206 to cover the uppermost one of the mold insulating layers 215.

Figure 14D:
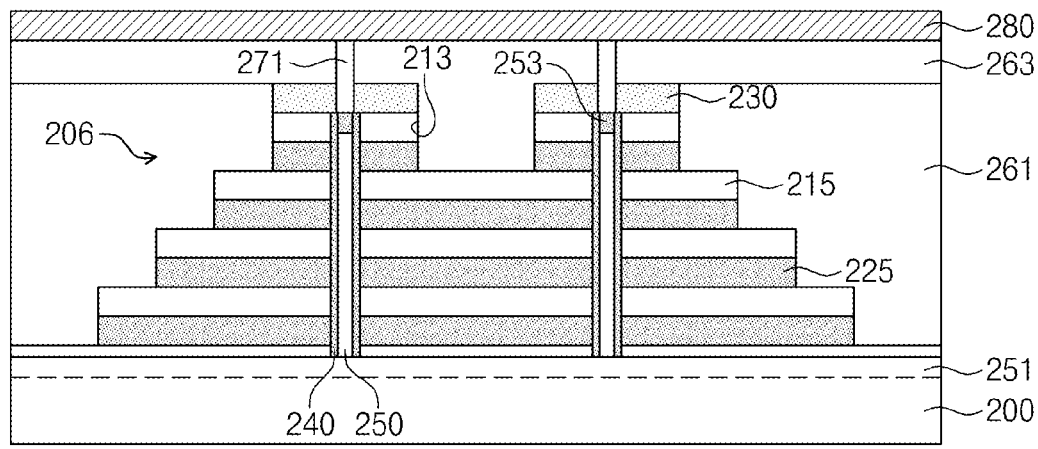

Referring to FIG. 14D, the dielectric capping layer 261 is formed to cover the staircases 211 of the gate stack 206, and the uppermost one of the mold insulating layers 215 and the gates 225 are patterned to form the slit 213. Next, the interlayer dielectric layer 263 filling the slit 213 is formed on the stress buffer layer 230 and the dielectric capping layer 261, the bit line contact 271 contacting the drain 253 is formed to penetrate the interlayer dielectric layer 263, and the bit line 280 is formed on the interlayer dielectric layer 263 to be connected to the bit line contact 271. Through the above processes, a semiconductor memory device 14, that comprises the stress buffer layer 230 covering a top surface of the gate stack 206 and the vertical channel 250 penetrating the gate stack 206, is fabricated.

Another method for fabricating a semiconductor memory device according to the inventive concept is illustrated in FIGS. 15A to 15D.

Figure 15A:
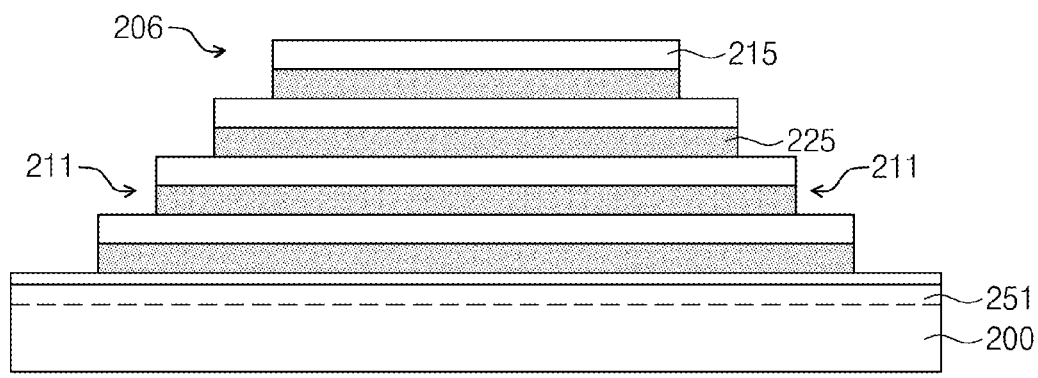
FIGS. 15A, 15B, 15C and 15D are cross-sectional views illustrating a method for fabricating a semiconductor memory device according to the inventive concept.

Referring to FIG. 15A, the mold insulating layers 215 and the gates 225 are alternately stacked to form the gate stack 206 on the substrate 200 including the common source 251 formed thereon. The gate stack 206 may be anisotropically etched to form the staircases 211 at the sides of the gate 206.

Figure 15B:
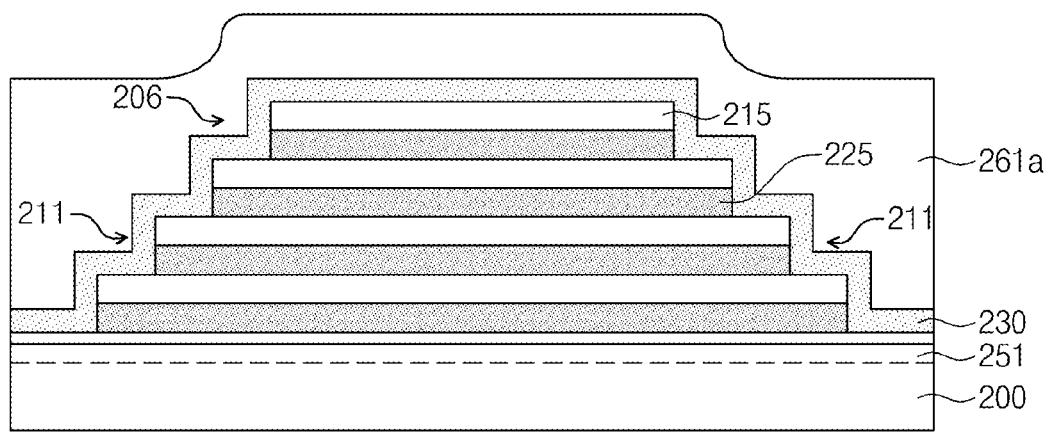

Referring to FIG. 15B, the stress buffer layer 230 is formed to cover the gate stack 206, and a dielectric layer 261a is formed to cover the stress buffer layer 230. The stress buffer layer 230 may have one portion in the shape of a plate and covering a top surface of the gate stack 206 and another portion in the shape of staircases covering sides of the gate stack 206. The stress buffer layer 230 may be a silicon nitride layer (e.g., SiN, $Si_3N_4$), a silicon oxide layer (e.g., $SiO_2$), a silicon oxynitride layer (e.g., SiON), or any combination thereof.

Figure 15C:
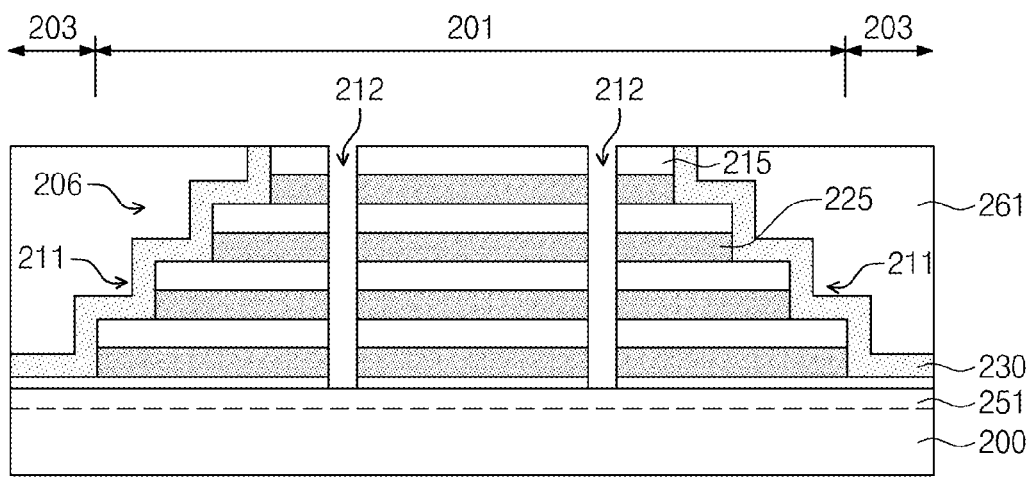

Referring to FIG. 15C, the dielectric layer 261a is planarized by, for example, a chemical mechanical polishing process to form the dielectric capping layer 261, and the channel hole 212 is formed to penetrate the gate stack 206. When the dielectric layer 261a formed on a cell region 201 and a peripheral region 203 is polished, part of the stress buffer layer 230 is removed from the cell region 201 to expose the uppermost one of the mold insulating layers 215. The polishing process, however, leaves the portions of the stress buffer layer 230 in the shape of staircases covering the staircases 211, i.e., sides of the gate stack 206, respectively. The gate stack 206, whose top surface is exposed, is anisotropically etched to form the channel hole 212. The stress buffer layer 230 may prevent or inhibit warping of the substrate 200 caused by the stress generated due to the forming of the channel hole 212.

Figure 15D:
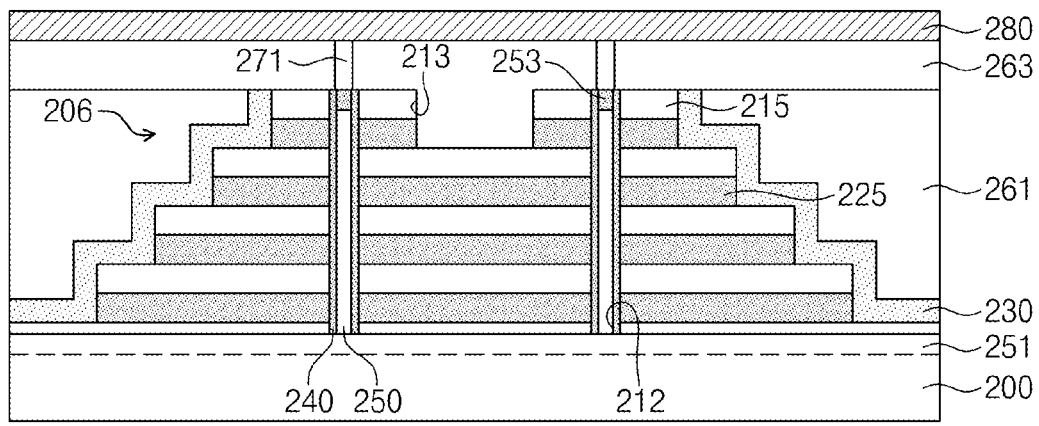

Referring to FIG. 15D, the memory layer 240 and the vertical channel 250 are formed in the channel hole 121, the drain 253 is formed at the top portion of the vertical channel 250, and the uppermost one of the mold insulating layers 215 and the gates 225 are patterned to form the slit 213. Next, the interlayer dielectric layer 263 filling the slit 213 is formed on the dielectric capping layer 261 and the gate stack 206, the bit line contact 271 contacting the drain 253 is formed to penetrate the interlayer dielectric layer 263, and the bit line 280 is formed on the interlayer dielectric layer 263 to be connected to the bit line contact 271. Through the above processes, a semiconductor memory device 15 that comprises the stress buffer layer 230 covering the sidewall of the gate stack 206 and the vertical channel 250 penetrating the gate stack 206, is fabricated.

Figure 16A:
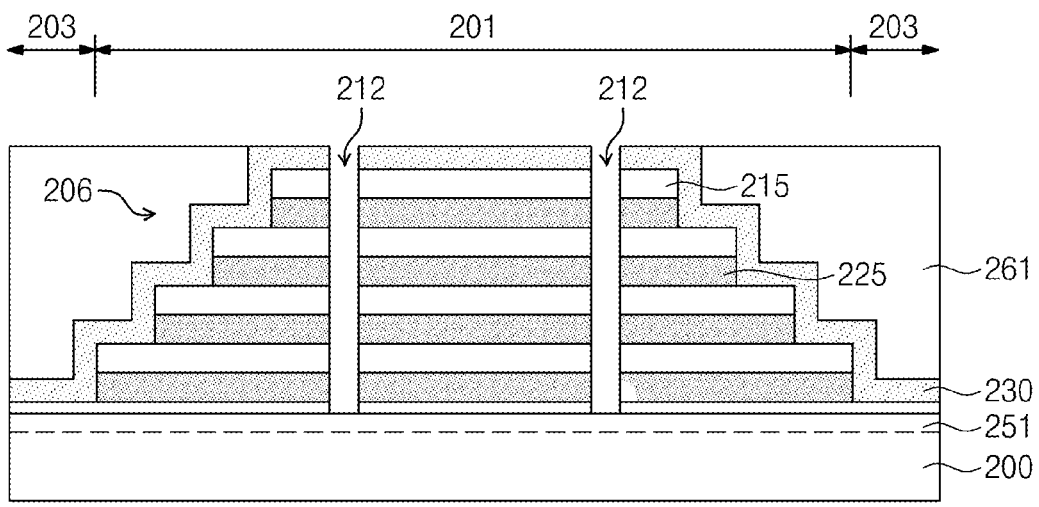
FIGS. 16A and 16B are cross-sectional views illustrating a method for fabricating a semiconductor memory device according to the inventive concept.
Figure 16B:
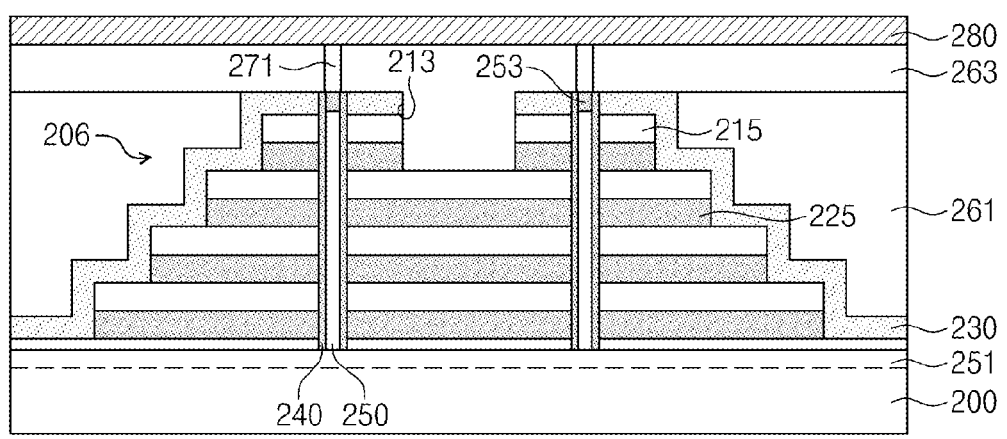

Another method for fabricating a semiconductor memory device according to the inventive concept is illustrated by FIGS. 16A and 16B.

Referring to FIG. 16A, in this example, the dielectric layer 261a is polished to expose the stress buffer layer 230, as an alternative to the process described with reference to FIG. 15C. Consequently, the dielectric capping layer 261 exposes a portion of the stress buffer layer 230 on the cell region 201. The stress buffer layer 230 has one portion in the shape of a plate and covering the top surface of the gate stack 206 and another portion in the shape of staircases covering sides of the gate stack 206. The stress buffer layer 230 and the gate stack 206 may be anisotropic ally etched to form the channel hole 212.

Referring to FIG. 16B, processes similar to those described with reference to FIG. 15D are performed to fabricate a semiconductor memory device 16 that comprises the stress buffer layer 230 covering the top surface and sides of the gate stack 206 and the vertical channel 250 penetrating the stress buffer layer 230 as well as the gate stack 206.

Figure 17A:
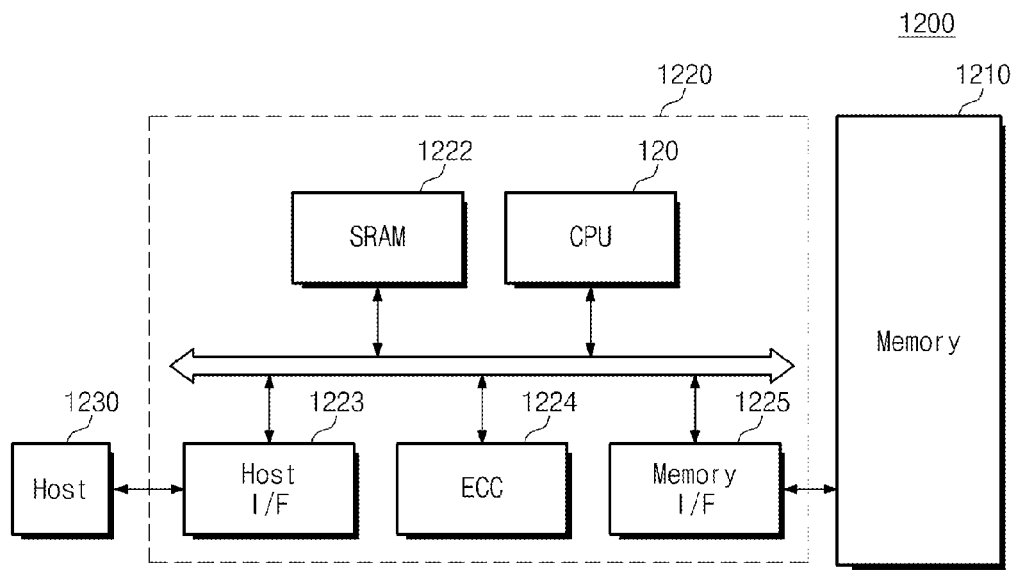
FIG. 17A is a block diagram illustrating an example of memory cards including a semiconductor memory device according to the inventive concept.

FIG. 17A schematically illustrates an example of memory cards including a semiconductor memory device (or device fabricated) according to the inventive concept.

Referring to FIG. 17A, a memory 1210 including at least one of the semiconductor memory devices 1 to 17 (or device fabricated) according to the inventive concept is employed by a memory card 1200. For example, the memory card 1200 may include a memory controller 1220 generally controlling data exchange between a host 1230 and the memory 1210. An SRAM 1221 is used as a work memory of a processing unit 1222. A host interface 1223 has a data exchange protocol of a host connected to the memory card 1200. An error correction coding block 1224 detects and corrects errors of data that are read from the memory 1210. A memory interface 1225 interfaces the memory 1210 in this example. The processing unit 1222 generally controls data exchange of the memory controller 1220.

Figure 17B:
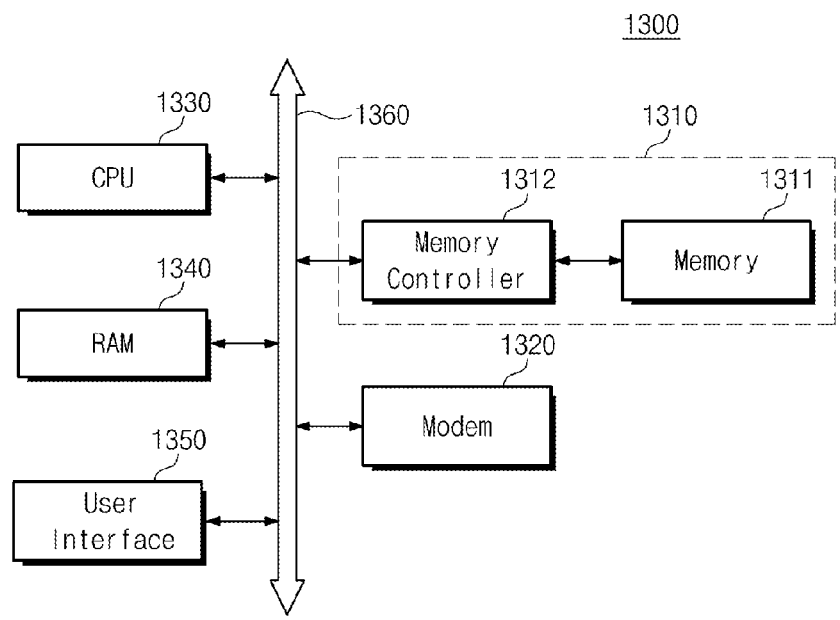
FIG. 17B is a block diagram illustrating an example of an information process system including a semiconductor memory device according to the inventive concept.

FIG. 17B schematically illustrates an example of an information process system including a semiconductor memory device (or device fabricated) according to the inventive concept.

Referring to FIG. 17B, an information processing system 1300 may include a memory system 1310 having at least one of the semiconductor memory devices 1 to 17 (or device fabricated) according to the inventive concept. The information processing system 1300 includes a mobile device or a computer. For example, the information processing system 1300 may include a modem 1320, a central processing unit 1330, a RAM 1340, and a user interface 1350 electrically connected to the memory system 1310 via a system bus 1360. The memory 1310 may include a memory 1311 and a memory controller 1312 and have substantially the same configuration as that of the memory card 1200 in FIG. 17A. The memory system 1310 stores data processed by the central processing unit 1330 or data input from the outside. The information process system 1300 may comprise a memory card, a solid state drive (SSD), a semiconductor device disk, a camera image sensor, or other application chipsets. In some embodiments, the memory system 1310 may be employed by a solid state drive (SSD), and in this case, the information processing system 1300 may stably and reliably store a large amount of data in the memory system 1310.

According to the inventive concept, stress in the fabrication of a three-dimensional semiconductor device can be suppressed by the stress buffer layer, to prevent a process failure and improve product yield. In particular, the stress buffer layer inhibits warping of the substrate. Therefore, the structural quality of a semiconductor memory device can be improved and reliable electrical characteristics can be obtained.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A semiconductor memory device comprising:
    a substrate including a cell region and a peripheral region;
    a gate stack including insulating layers and gates alternately stacked on and confined to the cell region of the substrate, at least one side of the gate stack having the form of a staircase;
    a stress buffer layer on the gate stack;
    a column, comprising a vertical channel, extending vertically through the stress buffer layer and the gate stack, the vertical channel being electrically connected to the substrate;
    a memory layer surrounding the vertical channel; and
    a bit line on the gate stack and electrically connected to the vertical channel.

2. The device of claim 1, wherein the stress buffer layer covers the uppermost gate of the gate stack.

3. The device of claim 1, wherein the stress buffer layer has the shape of a plate, extends across the cell and peripheral regions, and covers the uppermost gate of the gate stack.

4. The device of claim 1, wherein at least one portion of the stress buffer layer has the shape of a staircase, and the at least one portion of the stress buffer layer covers the at least one side of the gate stack.

5. The device of claim 4, wherein the stress buffer layer has a portion covering the uppermost gate of the gate stack.

6. The device of claim 1, wherein the stress buffer layer has:
    a first portion having the shape of a staircase on the cell region and covering the at least one side of the gate stack; and
    a second portion having the shape of a plate and covering the peripheral region of the substrate, the second portion of the buffer layer extending contiguously from the first portion of the buffer layer.

7. The device of claim 6, wherein the buffer layer also has a portion covering the uppermost gate of the gate stack.

8. The device of claim 1, wherein the column comprises a pillar of semiconductor material.

9. The device of claim 1, wherein the column comprises a drain within the stress buffer layer.

10. The device of claim 1, wherein the memory layer extends vertically through the stress buffer layer.

11. A semiconductor memory device comprising:
    a substrate including a cell region and a peripheral region;
    a gate stack including insulating layers and gates alternately stacked on and confined to the cell region of the substrate, at least one side of the gate stack having the form of a staircase;
    a stress buffer layer on the gate stack;
    a vertical channel extending vertically through the gate stack and electrically connected to the substrate;
    a memory layer surrounding the vertical channel; and
    a bit line on the gate stack and electrically connected to the vertical channel, and
    wherein the stress buffer layer has the shape of a plate, extends across the cell and peripheral regions, and covers the uppermost gate of the gate stack.

* * * * *